United States Patent
Zhou et al.

(10) Patent No.: US 11,665,940 B2
(45) Date of Patent: May 30, 2023

(54) DISPLAY SUBSTRATE FOR AVOIDING BREAKS AND PREPARATION METHOD THEREOF, BONDING METHOD OF DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Weifeng Zhou, Beijing (CN); Jiafan Shi, Beijing (CN); Liqiang Chen, Beijing (CN); Wenqiang Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 135 days.

(21) Appl. No.: 17/235,959

(22) Filed: Apr. 21, 2021

(65) Prior Publication Data
US 2022/0102462 A1    Mar. 31, 2022

(30) Foreign Application Priority Data
Sep. 29, 2020    (CN) .......................... 202011050772.8

(51) Int. Cl.
*H10K 59/131*    (2023.01)
*H10K 77/10*    (2023.01)
*H10K 71/00*    (2023.01)
*H01L 27/32*    (2006.01)
*H01L 51/00*    (2006.01)
*H01L 51/56*    (2006.01)

(52) U.S. Cl.
CPC ...... *H01L 27/3276* (2013.01); *H01L 51/0097* (2013.01); *H01L 51/56* (2013.01)

(58) Field of Classification Search
None
See application file for complete search history.

(56) References Cited

U.S. PATENT DOCUMENTS

2022/0069051 A1* 3/2022 Lee ..................... H01L 27/3262

* cited by examiner

*Primary Examiner* — J. E. Schoenholtz
(74) *Attorney, Agent, or Firm* — Ling Wu; Stephen Yang; Ling and Yang Intellectual Property

(57) ABSTRACT

Provided are a display substrate, a preparation method thereof, a method for bonding a display panel, and a display apparatus. The display substrate includes a display region and a bezel region, the display region includes multiple corner regions and the corner regions include a corner display region and a blank corner cutting region which are alternately disposed. The corner display region includes a composite wiring layer disposed on a base substrate, a drive structure layer disposed on the composite wiring layer and light-emitting elements disposed on the drive structure layer. The composite wiring layer includes a first wiring layer, a second wiring layer and a first insulating layer disposed between the first wiring layer and the second wiring layer. The drive structure layer includes a pixel drive circuit and multiple connection electrodes. The first wiring layer includes a gate line, and the second wiring layer includes a data line.

14 Claims, 13 Drawing Sheets

DISPLAY SUBSTRATE FOR AVOIDING BREAKS AND PREPARATION METHOD THEREOF, BONDING METHOD OF DISPLAY PANEL AND DISPLAY APPARATUS

CROSS-REFERENCE TO RELATED APPLICATION

The present application claims the priority of Chinese Patent Application No. 202011050772.8 filed to the CNIPA on Sep. 29, 2020, the content of which is hereby incorporated by reference.

TECHNICAL FIELD

Embodiments of present disclosure relate to, but are not limited to, the field of display technology, in particular to a display substrate, a method for preparing the display substrate, a method for bonding a display panel, and a display apparatus.

BACKGROUND

With rapid development of display technology, curved screens have become a hot topic in the display field. The radian of side surfaces of a curved screen can increase the display area and screen-to-body ratio, thus bring better sensory experience to users.

Curved screens include dual-edge curved screens formed by two opposite sides of the display screen with a certain curvature and four-edge curved screens formed by four sides of the display screen with a certain curvature. For a four-edge curved screen, the curved sides of the curved screen have at least two adjacent curved parts. During preparation, wrinkles tend to appear at a joint between the adjacent curved parts, causing metal wirings and inorganic layer at the joint to break easily, which reduces the product quality.

SUMMARY

The following is a summary of the subject matter described in detail in the present disclosure. This summary is not intended to limit the protection scope of the claims.

Embodiments of the present disclosure provide a display substrate, which includes a display region and a bezel region. The display region includes multiple corner regions, and at least one of the multiple corner regions includes a corner display region and a blank corner cutting region which are alternately disposed. The corner display region includes a composite wiring layer disposed on a base substrate, a drive structure layer disposed on the composite wiring layer and a light-emitting element disposed on the drive structure layer. The composite wiring layer includes a first wiring layer, a second wiring layer and a first insulating layer disposed between the first wiring layer and the second wiring layer. The drive structure layer includes a pixel drive circuit and multiple connection electrodes. The first wiring layer includes a gate line, and the second wiring layer includes a data line, wherein the gate line, the data line and the light-emitting element are connected to the pixel drive circuit through the multiple connection electrodes.

In an exemplary embodiment, the pixel drive circuit includes a first transistor, the multiple connection electrodes include a first connection electrode, a second connection electrode and a fourth connection electrode, and the light-emitting element includes an anode, a cathode and an organic light-emitting layer disposed between the anode and the cathode; the first connection electrode is connected to the gate line and a gate electrode of the first transistor, the second connection electrode is connected to the data line and a source electrode of the first transistor, and the fourth connection electrode is connected to the anode and a drain electrode of the first transistor.

In an exemplary embodiment, the bezel region includes a power supply line, a third connection electrode and a fifth connection electrode, wherein the power supply line is disposed on the first wiring layer or the second wiring layer; the third connection electrode is disposed in a same layer as the source electrode and the drain electrode of the first transistor; the fifth connection electrode and the anode are disposed in a same layer; the third connection electrode is connected to the power supply line and the fifth connection electrode, and the fifth connection electrode is connected to the third connection electrode and the cathode.

In an exemplary embodiment, the base substrate includes a first flexible material layer and a first barrier layer disposed on the first flexible material layer. The composite wiring layer is disposed on the first barrier layer.

In an exemplary embodiment, the base substrate includes a first flexible material layer, a first barrier layer disposed on the first flexible material layer, a second insulating layer, and a second flexible material layer disposed on the second insulating layer. The composite wiring layer is disposed between the first barrier layer and the second insulating layer.

In an exemplary embodiment, an edge of the blank corner cutting region facing the bezel region is a first arc, and an edge of the corner display region facing the bezel region is a second arc, wherein the first arc and the second arc are located on a circle with a same center and a same radius.

In an exemplary embodiment, an arc length of the first arc is 18 to 35 microns, and an arc length of the second arc is 180 to 250 microns.

An embodiment of the present disclosure further provides a display apparatus which includes any one of the aforementioned display substrates.

An embodiment of the present disclosure further provides a method for preparing a display substrate including a display region and a bezel region, wherein the display region includes multiple corner regions, and at least one of the multiple corner regions includes a corner display region and a blank corner cutting region which are alternately disposed. The preparation method includes:

forming a composite wiring layer on a base substrate, wherein the composite wiring layer of the corner display region includes a first wiring layer, a second wiring layer and a first insulating layer disposed between the first wiring layer and the second wiring layer, wherein the first wiring layer includes a gate line and the second wiring layer includes a data line;

forming a drive structure layer on the composite wiring layer, wherein the drive structure layer of the corner display region includes a pixel drive circuit and multiple connection electrodes;

forming a light-emitting element on the drive structure layer, removing all layer film structures in the blank corner cutting region; wherein the gate line, the data line, and the light-emitting element are connected to the pixel drive circuit through the multiple connection electrodes.

In an exemplary embodiment, the pixel drive circuit includes a first transistor; the multiple connection electrodes include a first connection electrode, a second connection electrode and a fourth connection electrode; the light-emitting element includes an anode, a cathode and an organic light-emitting layer disposed between the anode and the cathode; and the bezel region includes a power supply line, a third connection electrode and a fifth connection electrode;

the drive structure layer includes a second insulating layer disposed on the composite wiring layer, an active layer disposed on the second insulating layer, a third insulating layer covering the active layer, a first gate metal layer disposed on the third insulating layer, a fourth insulating layer covering the first gate metal layer, a second gate metal layer disposed on the fourth insulating layer, a fifth insulating layer covering the second gate metal layer, a first source and drain metal layer disposed on the fifth insulating layer, a passivation layer disposed on the first source and drain metal layer, a first planarization layer disposed on the passivation layer, a metal conductive layer on the planarization layer, and a second planarization layer disposed on the metal conductive layer;

wherein the power supply line is disposed on the first wiring layer or the second wiring layer;

the first connection electrode is disposed on the second gate metal layer and is connected to the gate line and a gate electrode of the first transistor;

the second connection electrode and the third connection electrode are disposed on the first source and drain metal layer; the second connection electrode is connected to the data line and a source electrode of the first transistor; the third connection electrode is connected to the power supply line and the fifth connection electrode;

the fourth connection electrode is disposed on the metal conductive layer and is connected to the anode and a drain electrode of the first transistor; and the fifth connection electrode is disposed in a same layer as the anode, and is connected to the third connection electrode and the cathode.

An embodiment of the present disclosure further provides a method for bonding a display panel including a display region and a bezel region, wherein the display region includes multiple corner regions, and at least one of the multiple corner regions includes a corner display region and a blank corner cutting region which are alternately disposed. The bonding method includes:

forming an optical adhesive layer on a side of the display panel facing the cover plate, wherein the optical adhesive layer includes multiple first fan-shaped regions and first opening regions which are alternately disposed; an orthographic projection of the corner display region on the display panel includes an orthographic projection of the first fan-shaped regions on the display panel, and an orthographic projection of the first opening regions on the display panel includes an orthographic projection of the blank corner cutting region on the display panel;

bonding a back film on a side of the display panel away from the cover plate;

pulling the display panel through a carrier film for copying; and bonding the display panel to the cover plate, and removing the carrier film.

In an exemplary embodiment, the back film includes multiple second fan-shaped regions and second opening regions which are alternately disposed; an orthographic projection of the corner display region on the display panel includes an orthographic projection of the second fan-shaped regions on the display panel, and an orthographic projection of the second opening regions on the display panel includes the orthographic projection of the blank corner cutting region on the display panel. The carrier film includes multiple third fan-shaped regions and third opening regions which are alternately disposed; an orthographic projection of the corner display region on the display panel includes an orthographic projection of the third fan-shaped regions on the display panel, and an orthographic projection of the third opening regions on the display panel includes the orthographic projection of the blank corner cutting region on the display panel.

In an exemplary embodiment, an edge of the corner display region facing the bezel region is a second arc; an edge of the first fan-shaped region facing the bezel region is a third arc, and an arc length of the third arc is smaller than that of the second arc by 20 microns to 50 microns; an edge of the second fan-shaped region facing the bezel region is a fourth arc, and an arc length of the fourth arc is smaller than that of the second arc by 20 microns to 50 microns; an edge of the third fan-shaped region toward the bezel region is a fifth arc, and an arc length of the fifth arc is smaller than that of the second arc by 20 microns to 50 microns.

In an exemplary embodiment, the back film includes a fourth opening region, and an orthographic projection of the fourth opening region on the display panel includes the orthographic projection of the corner region on the display panel; the carrier film includes a fifth opening region, and an orthographic projection of the fifth opening region on the display panel includes the orthographic projection of the corner region on the display panel.

Other features and advantages of the present disclosure will be set forth in embodiments disclosed below, and in part will become apparent from the embodiments of the disclosure, or may be learned by practice the embodiments of the present disclosure. Purposes and other advantages of the technical schemes of the present disclosure may be achieved and acquired by structures specified in the detailed description and drawings.

Other aspects will become apparent upon reading and understanding accompanying drawings and the detailed description.

BRIEF DESCRIPTION OF DRAWINGS

The accompanying drawings are used to provide a further understanding of the technical solution of the present disclosure, and constitute a part of the embodiments of the present disclosure. They are used together with the embodiments of the present application to explain the technical solution of the present disclosure, and do not constitute a restriction on the technical solution of the present disclosure. Shapes and sizes of the components in the drawings do not reflect true proportions and only to be used to schematically illustrate contents of the present disclosure.

DETAILED DESCRIPTION

Figure 1:
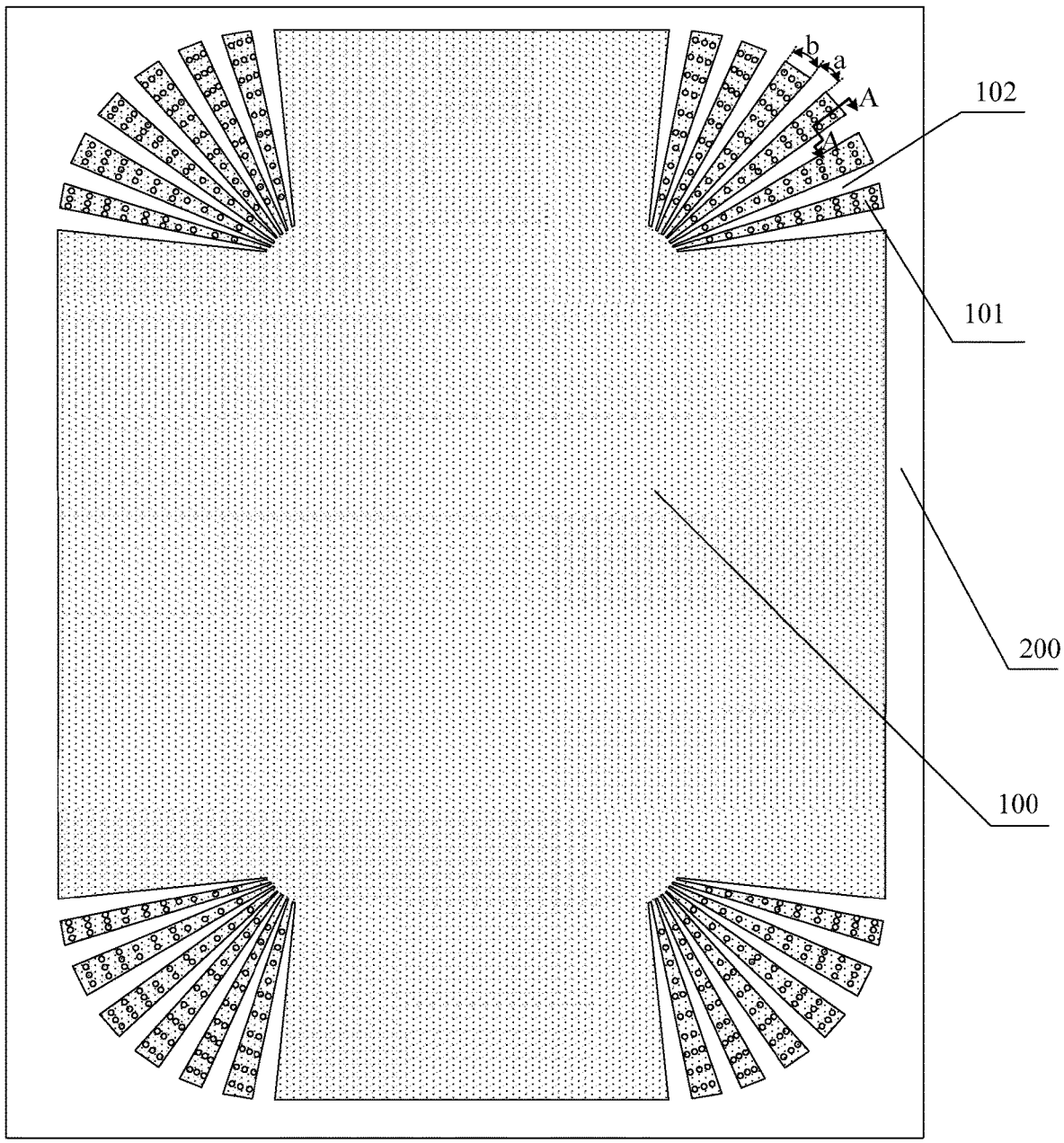
FIG. 1 is a schematic diagram of the plane structure of a display substrate according to an embodiment of the present disclosure.

Hereinafter embodiments of the present disclosure will be described in detail with reference to the accompanying drawings. It should be noted that the embodiments may be implemented in a number of different forms. Those of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the accompanying drawings, sizes of constituent elements and thicknesses and areas of layers are sometimes exaggerated for clarity. Therefore, an implementation of the present disclosure is not necessarily limited to the sizes shown. The shapes and sizes of components in the accompanying drawings do not reflect true proportions. In addition, the accompanying drawings schematically show ideal examples, and an implementation of the present disclosure is not limited to the shapes or values shown in the accompanying drawings.

The "first", "second", "third" and other ordinal numbers in the embodiments of the present disclosure are used to avoid confusion of constituent elements, not to provide any quantitative limitation.

In the embodiments of the present disclosure, for the sake of convenience, wordings such as "central", "upper", "lower", "front", "rear", "vertical", "horizontal", "top", "bottom", "inner", "outer" and the others describing the orientations or positional relations are used to depict the relations between constituent elements with reference to the accompanying drawings, which are only for an easy and simplified description in the present disclosure, rather than for indicating or implying that the device or element referred to must have a specific orientation, or must be constructed and operated in a particular orientation and therefore, those wordings cannot be construed as limitations on the present disclosure. The positional relations of the constituent elements may be appropriately changed according to the direction in which each constituent element is described. Therefore, they are not limited to the wordings in the embodiments of the present disclosure and may be replaced appropriately on a case-by-case basis.

In the embodiments of the present disclosure, the terms "install", "connect" and "couple" shall be broadly understood unless otherwise explicitly specified and defined. For example, a connection may be a fixed connection, or may be a detachable connection, or an integrated connection; it may be a mechanical connection, or may be an electrical connection; it may be a direct connection, or may be an indirect connection through middleware, or may be an internal connection between two elements. Those of ordinary skills in the art can understand the specific meanings of the above mentioned terms in the present disclosure according to specific context.

In the embodiments of present disclosure, a transistor refers to an element including at least three terminals, namely, a gate electrode, a drain electrode and a source electrode. The transistor has a channel region between the drain electrode (also referred to as a drain electrode terminal, a drain region or a drain electrode) and the source electrode (also referred to as a source electrode terminal, a source region or a source electrode), and a current can flow through the drain electrode, the channel region and the source electrode. It should be noted that in the embodiments of the present disclosure, a channel region refers to a region through which the current mainly flows.

In the embodiments of the present disclosure, a first electrode may be a drain electrode while a second electrode may be a source electrode, or a first electrode may be a source electrode while a second electrode may be a drain electrode. In a case where transistors with opposite polarities are used or a current direction is changed in operation of a circuit, a function of the "source electrode" and a function of the "drain electrode" sometimes are interchangeable. Therefore, in the embodiments of the present disclosure, "source electrodes" and "drain electrodes" are interchangeable.

In the embodiments of the present disclosure, "an electrical connection" includes a case where constituent elements are connected via an element having a certain electrical action. The "element having a certain electrical action" is not particularly limited as long as it can transmit and receive electrical signals between the connected constituent elements. Examples of the "elements having a certain electrical function" include not only electrodes and wirings, but also switching elements such as transistors, resistors, inductors, capacitors, and other elements having various functions.

In the embodiments of the present disclosure, "parallel" refers to a state in which two straight lines form an angle above −10 degrees and below 10 degrees, and thus also includes a state in which the angle is above −5 degrees and below 5 degrees. In addition, "perpendicular" refers to a state in which two straight lines form an angle above 80 degrees below 100 degrees, and thus also includes a state in which the angle is above 85 degrees and below 95 degrees.

In the embodiments of the present disclosure, "film" and "layer" may be interchanged. For example, sometimes a "conductive layer" may be replaced with a "conductive film". Similarly, an "insulating film" may sometimes be replaced with an "insulating layer".

In the present disclosure, "about" in the present disclosure means that there is no strict limit for a value and values within an error range during processes and measurement are allowed.

An embodiment of the present disclosure provides a display substrate including a display region and a bezel region, wherein the display region includes multiple corner regions, and at least one of the multiple corner regions includes a corner display region and a blank corner cutting region which are alternately disposed.

In a plane perpendicular to the display substrate, the corner display region includes a composite wiring layer disposed on a base substrate, a drive structure layer disposed on the composite wiring layer and a light-emitting element disposed on the drive structure layer. The composite wiring layer includes a first wiring layer, a second wiring layer and a first insulating layer disposed between the first wiring layer and the second wiring layer. The drive structure layer includes a pixel drive circuit and multiple connection electrodes.

The first wiring layer includes a gate line, and the second wiring layer includes a data line, wherein the gate line, the data line and the light-emitting element are connected to the pixel drive circuit through multiple connection electrodes. The light-emitting element is configured to emit light, and the pixel drive circuit is configured to drive the light-emitting element.

According to the display substrate provided by the embodiment of the disclosure, by disposing the composite wiring layer below the drive structure layer, signal wiring in the corner display region can be routed from below the light-emitting element, and there is no signal wiring in the blank corner cutting region at the corner position. When the cover plate is bonded, the blank corner cutting region is compressed, and the corner display regions are in contact with each other to form a whole, which effectively eliminates wrinkles formed by the compression. During the bonding, metal wiring and inorganic layers in the display substrate will not break, thus improving display quality.

Figure 2:
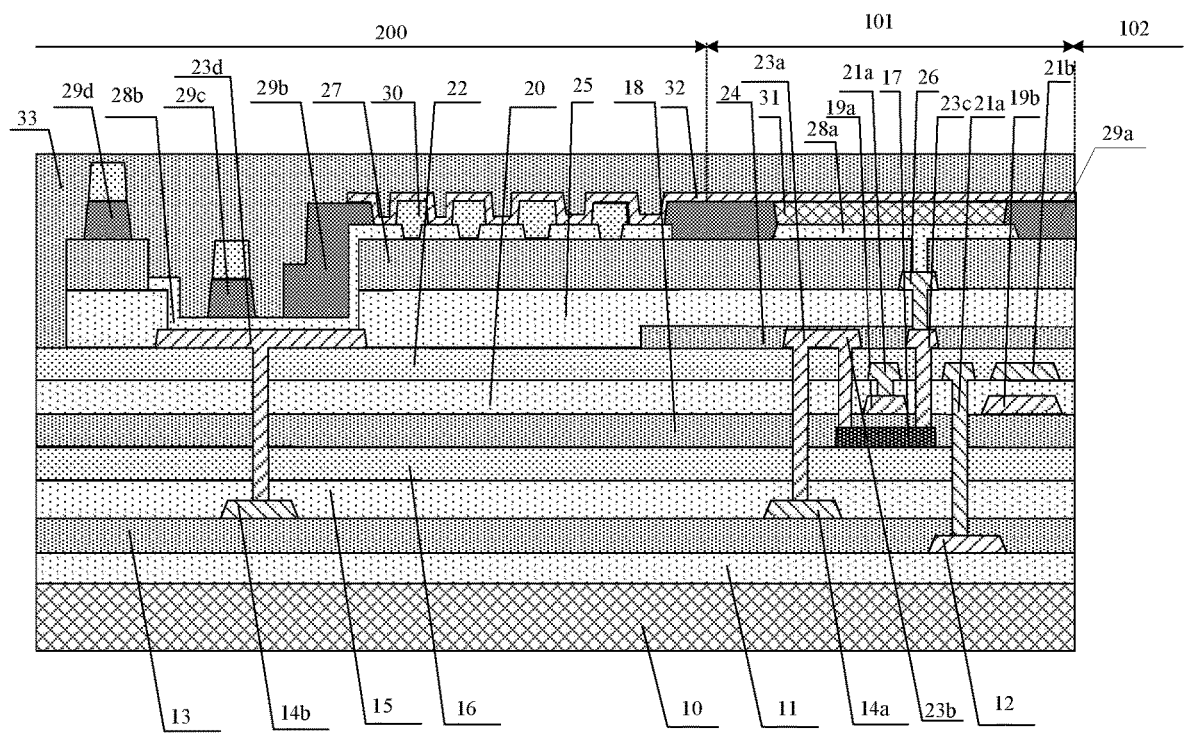
FIG. 2 is a schematic diagram of a cross-sectional structure of the display substrate shown in FIG. 1 in AA direction.
Figure 3:
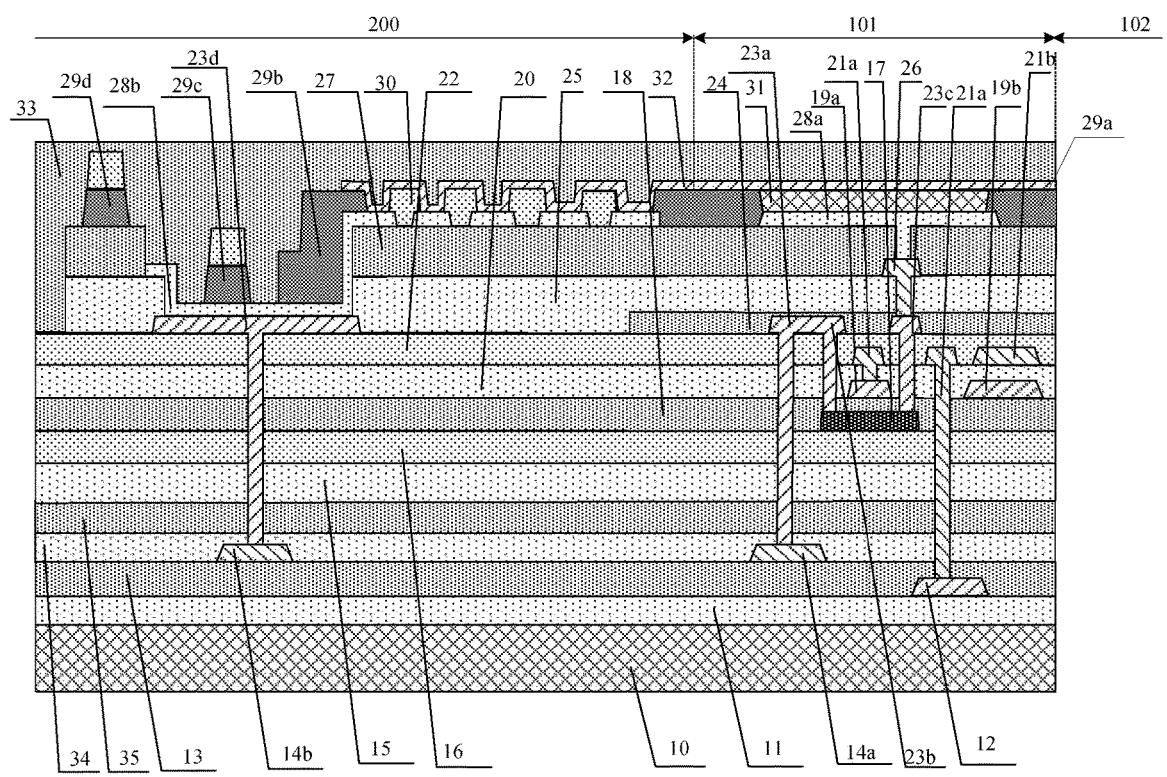
FIG. 3 is another schematic diagram of a cross-sectional structure of the display substrate shown in FIG. 1 in AA direction.

FIG. 1 is a schematic diagram of a plane structure of a display substrate according to an embodiment of the present disclosure. FIG. 2 is a schematic diagram of a cross-sectional structure in AA direction of the display substrate shown in FIG. 1. FIG. 3 is another schematic diagram of a cross-sectional structure in AA direction of the display substrate shown in FIG. 1. As shown in FIG. 1, FIG. 2 and FIG. 3, in an exemplary embodiment, the display substrate includes a display region 100 and a bezel region 200, wherein the display region 100 includes multiple corner regions, and at least one of the multiple corner regions includes a corner display region 101 and a blank corner cutting region 102 which are alternately disposed.

In a plane perpendicular to the display substrate, the corner display region 101 includes a composite wiring layer disposed on a base substrate, a drive structure layer disposed on the composite wiring layer and a light-emitting element disposed on the drive structure layer. The composite wiring layer includes a first wiring layer, a second wiring layer and a first insulating layer 13 disposed between the first wiring layer and the second wiring layer. The drive structure layer includes a pixel drive circuit and multiple connection electrodes.

The first wiring layer includes a gate line 12, and the second wiring layer includes a data line 14a, wherein the gate line 12, the data line 14a and the light-emitting element are connected to the pixel drive circuit through multiple connection electrodes. The light-emitting element is configured to emit light, and the pixel drive circuit is configured to drive the light-emitting element.

In an exemplary embodiment, the pixel drive circuit may include multiple thin film transistors (TFTs) and storage capacitors, such as 3T1C, 4T1C, 5T1C, 6T1C or 7T1C, which is not limited by the present disclosure.

Figure 4:
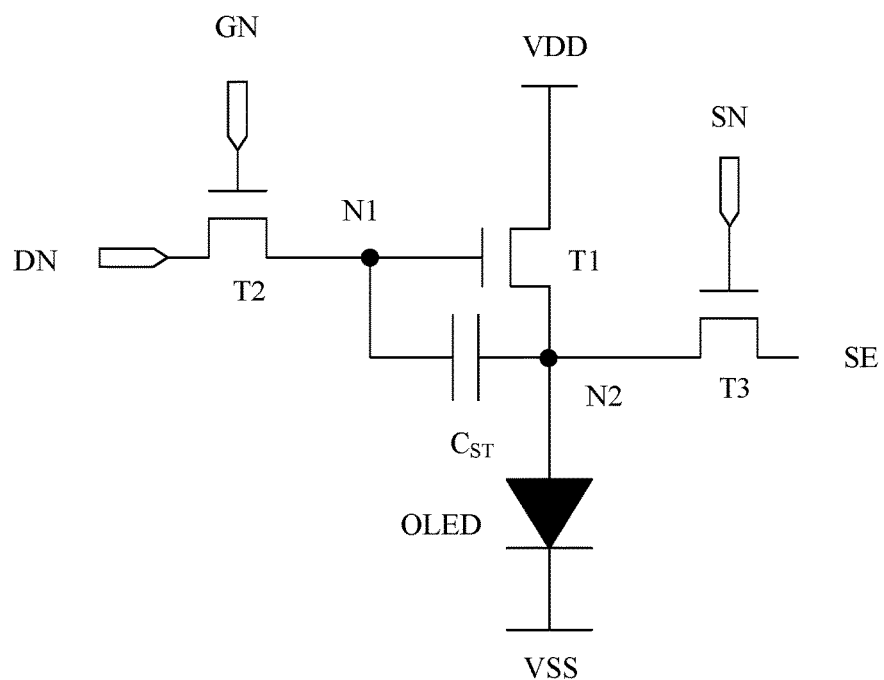
FIG. 4 is a schematic diagram of a structure of a pixel drive circuit according to an embodiment of the present disclosure.

FIG. 4 is a schematic diagram of an equivalent circuit of a pixel drive circuit, illustrating a driving structure of 3T1C. As shown in FIG. 3, the pixel drive circuit is electrically connected to a first scanning line GN, a second scanning line SN, a data line DN, a first power supply line VDD and a compensation line SE. The pixel drive circuit includes a first transistor T1, a second transistor T2, a third transistor T3 and a storage capacitor $C_{ST}$. In an exemplary embodiment, the first transistor T1 is a drive transistor, the second transistor T2 is a switch transistor, and the third transistor T3 is a compensation transistor. In an exemplary embodiment, a gate electrode of the first transistor T1 is connected to a second electrode of the second transistor T2 and a first electrode of the storage capacitor $C_{ST}$, a first electrode of the first transistor T1 is connected to the first power supply line VDD, and a second electrode of the first transistor T1 is connected to a second electrode of the storage capacitor $C_{ST}$ and a second electrode of the third transistor T3. A gate electrode of the second transistor T2 is connected to the scanning line GN, and a first electrode of the second transistor T2 is connected to the data line DN. A gate electrode of the third transistor T3 is connected to the second scanning line SN, and a first electrode of the third transistor T3 is connected to the compensation line SE. An anode of an OLED is connected to the second electrode of the first transistor T1, a cathode of the OLED is connected to the second power supply line VSS, and the OLED is configured to emit light with corresponding brightness in response to a current of the second electrode of the first transistor T1. In an exemplary embodiment, the third transistor T3 can extract a threshold voltage Vth and the mobility of the first transistor T1 in response to the timing of compensation to compensate for the threshold voltage Vth, and the storage capacitor $C_{ST}$ is configured to maintain the voltages of N1 node and the N2 within one frame of light emission period.

In an exemplary embodiment, as shown in FIGS. 2 and 3, the pixel drive circuit includes a first transistor, the multiple connection electrodes include a first connection electrode 21a, a second connection electrode 23a and a fourth connection electrode 26, and the light-emitting element includes an anode 28a, a cathode 32 and an organic light-emitting layer 31 disposed between the anode 28a and the cathode 32. The first connection electrode 21a is connected to the gate line 12 and a gate electrode 19a of the first transistor, the second connection electrode 23a is connected to the data line 14a and a source electrode 23b of the first transistor, and the fourth connection electrode 26 is connected to the anode 28a and a drain electrode 23c of the first transistor.

In an exemplary embodiment, as shown in FIGS. 2 and 3, the bezel region 200 includes a power supply line 14b, a third connection electrode 23d and a fifth connection electrode 28b. The power supply line 14b is disposed on the first wiring layer or the second wiring layer. The third connection electrode 23d is disposed in a same layer as the source electrode 23b and the drain electrode 23c of the first transistor. The fifth connection electrode 28b is disposed in a same layer as the anode 28a. The third connection electrode 23d is connected to the power supply line 14b and the fifth connection electrode 28b, and the fifth connection electrode 28b is connected to the third connection electrode 23d and the cathode 32.

In an exemplary embodiment, as shown in FIGS. 2 and 3, the drive structure layer includes a second insulating layer 16 disposed on the composite wiring layer, an active layer 17 disposed on the second insulating layer 16, a third insulating layer 18 covering the active layer 17, a first gate metal layer disposed on the third insulating layer 18, a fourth insulating layer 20 covering the first gate metal layer, a second gate metal layer disposed on the fourth insulating layer 20, a fifth insulating layer 22 covering the second gate metal layer, a first source and drain metal layer disposed on the fifth insulating layer 22, a passivation layer 24 disposed on the first source and drain metal layer, a first planarization layer 25 disposed on the passivation layer 24, a metal conductive layer on the planarization layer 25, and a second planarization layer 27 disposed on the metal conductive layer. The first connection electrode 21a is disposed on the second gate metal layer. The second connection electrode 23a and the third connection electrode 23d are disposed on the first source and drain metal layer. The fourth connection electrode 26 is disposed on the metal conductive layer.

In an exemplary embodiment, as shown in FIG. 2, the display substrate includes:

a first flexible material layer 10;

a first barrier layer 11 disposed on the first flexible material layer 10;

a first wiring layer disposed on the first barrier layer 11, wherein the first wiring layer includes a gate line 12 formed in the corner display region 101;

a first insulating layer 13 disposed on the first wiring layer;

a second wiring layer disposed on the first insulating layer 13, wherein the second wiring layer includes a data line 14a formed in the corner display region 101 and a power supply line 14b formed in the bezel region 200;

a second barrier layer 15 covering the second wiring layer;

a second insulating layer 16 disposed on the second barrier layer 15;

a semiconductor layer disposed on the second insulating layer 16, wherein the semiconductor layer includes an active layer 17 formed in the corner display region 101;

a third insulating layer 18 covering the semiconductor layer;

a first gate metal layer disposed on the third insulating layer 18, wherein the first gate metal layer includes a gate electrode 19a formed in the corner display region 101;

a fourth insulating layer 20 covering the first gate metal layer, on which a first via hole 20a exposing the gate electrode 19a and a second via hole 20b exposing the gate line 12 are provided;

a second gate metal layer disposed on the fourth insulating layer 20, wherein the second gate metal layer includes a first connection electrode 21a and a second capacitor electrode 21b, the first connection electrode 21a is connected to the gate electrode 19a and the gate line 12 through the first via hole 20a and the second via hole 20b respectively, and the second capacitor electrode 21b corresponds to the position of the first capacitor electrode 19b;

a fifth insulating layer 22 disposed on the second gate metal layer, on which a third via hole 22a exposing the power supply line 14b, a fourth via hole 22b exposing the data line 14a, a fifth via hole 22c and a sixth via hole 22d exposing two ends of the active layer 17 are provided;

a first source and drain metal layer disposed on the fifth insulating layer 22, wherein the first source and drain metal layer includes a second connection electrode 23a, a source electrode 23b and a drain electrode 23c formed in the corner display region 101, and a third connection electrode 23d formed in the bezel region 200. The source electrode 23b and the drain electrode 23c are connected to the two ends of the active layer 17 through a fifth via hole 22c and a sixth via hole 22d respectively, the second connection electrode 23a is connected to the source electrode 23b and the data line 14a through the fourth via hole 22b, and the third connection electrode 23d is connected to the power supply line 14b through the third via hole 22a;

a passivation layer 24 covering the first source and drain metal layer, and the passivation layer 24 above the third connection electrode 23d is removed;

a first planarization layer 25 and a metal conductive layer disposed on the passivation layer 24, wherein the first planarization layer 25 is provided with a seventh via hole exposing the drain electrode 23c and a first partition exposing the third connection electrode 23d, and the metal conductive layer includes a fourth connection electrode 26, wherein the fourth connection electrode 26 is connected to the drain electrode 23c through the seventh via hole;

a second planarization layer 27 disposed on the metal conductive layer, on which the seventh via hole exposing the fourth connection electrode 26 and a second partition exposing the first partition are provided;

an anode 28a and a fifth connection electrode 28b disposed on the second planarization layer 27, wherein the anode 28a is connected to the fourth connection electrode 26 through an eighth via hole, and the fifth connection electrode 28b is connected to the third connection electrode 23d, and multiple ninth via holes are provided on the fifth connection electrode 28b;

a pixel defining layer 29a disposed on the anode 28a, a pixel opening exposing the anode 28a is provided on the pixel defining layer 29a;

an organic light-emitting layer 31 disposed in the pixel opening, wherein the organic light-emitting layer 31 is connected to the anode 28a;

a cathode 32 disposed on the organic light-emitting layer 31 and the pixel defining layer 22, wherein the cathode 32 is connected to the organic light-emitting layer 31; and, an encapsulation layer 26 covering the above structure.

In an exemplary embodiment, the base substrate is a single-layer base substrate that includes a first flexible material layer 10 and a first barrier layer 11 disposed on the first flexible material layer 10, and a composite wiring layer is disposed on the first barrier layer 11.

In an exemplary embodiment, as shown in FIG. 3, the display substrate further includes a seventh insulating layer 34 and a second flexible material layer 35, wherein the seventh insulating layer 34 and the second flexible material layer 35 are disposed between the second wiring layer and the second barrier layer 15, and the second flexible material layer 35 is disposed on the seventh insulating layer 34.

In an exemplary embodiment, the base substrate is a double-layer base substrate that includes a first flexible material layer 10, a first barrier layer 11 disposed on the first flexible material layer 10, a seventh insulating layer 34, and a second flexible material layer 35 disposed on the seventh insulating layer 34. A composite wiring layer is disposed between the first barrier layer 11 and the seventh insulating layer 34.

In an exemplary embodiment, as shown in FIG. 1, an edge of the blank corner cutting region 102 facing the bezel region 200 is a first arc, and the edge of the corner display region 101 facing the bezel region 200 is a second arc, wherein the first arc and the second arc are located on a circle with a same center and a same radius.

In an exemplary embodiment, an arc length a of the first arc is about 18 to 35 microns, and an arc length b of the second arc is about 180 to 250 microns.

The following is an exemplary explanation through a process of preparing the display substrate. The "patterning process" mentioned in the embodiments of the present disclosure includes processes, such as photoresist coating, mask exposure, development, etching and photoresist stripping for metal materials, inorganic materials or transparent conductive materials, and includes organic material coating, mask exposure and development for organic materials. Deposition may be implemented by any one or more of sputtering, evaporation and chemical vapor deposition, the coating may be implemented by any one or more of spraying coating, spin coating and ink-jet printing, and the etching may be implemented by any one or more of dry etching and wet etching, and these are not limited in the present disclosure. A "thin film" refers to a layer of thin film manufactured by a certain material on a base substrate by using deposition, coating or another process. If the "thin film" does not need a patterning process during the whole manufacturing process, the "thin film" can also be called a "layer". If the "thin film" needs a patterning process throughout the whole manufacturing process, it is referred to as a "thin film" before the patterning process and as a "layer" after the patterning process. The "layer" after the patterning process contains at least one "pattern". In the present disclosure, "A and B are arranged on the same layer" indicates that A and B are simultaneously formed by the same patterning process, and "thickness" of a film layer is dimension of the film layer in a direction perpendicular to the display substrate. In an exemplary embodiment of the present disclosure, "an orthographic projection of B lies within the range of an orthographic projection of A" means that a boundary of the orthographic projection of B falls within a boundary range of the orthographic projection of A, or the boundary of the orthographic projection of A overlaps with the boundary of the orthographic projection of B.

Figure 5:
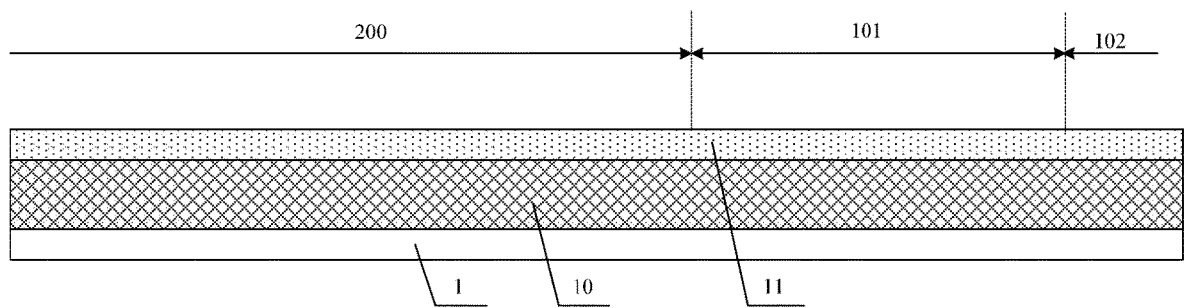
FIG. 5 is a schematic diagram of a display substrate after a first barrier layer is formed according to an embodiment of the present disclosure.

In an exemplary embodiment, as shown in FIG. 1, the display substrate includes a display region 100 and a bezel region 200. The display region 100 includes a main display region and multiple corner regions. The corner region include multiple corner display regions 101 and multiple blank corner cutting regions 102, wherein the multiple corner display regions 101 and the multiple blank corner cutting regions 102 are alternatively disposed. A process of preparing the base substrate includes following steps:

(1) Preparing a base substrate on a glass carrier plate 1. In an exemplary embodiment, as shown in FIG. 5, the base substrate includes a first flexible material layer 10 and a first barrier layer 11. The material of the first flexible material layer may be polyimide (PI), polyethylene terephthalate (PET) or surface-treated polymer soft film, etc. The material of the first barrier layer may be silicon nitride (SiNx) or silicon oxide (SiOx) to improve the moisture and oxygen resistance of the base substrate.

In an exemplary embodiment, the process for preparing of the base substrate may include: first coating a layer of polyimide on the glass carrier plate 1, curing to form a film, and then forming a first flexible (PI1) layer; then, depositing a first barrier thin film on the first flexible layer to form a first barrier layer (Barrier1) covering the first flexible layer. After this process, the bezel region 200, the corner display regions 101 and the blank corner cutting regions 102 all include the first flexible material layer 10 and the first barrier layer 11.

Figure 6:
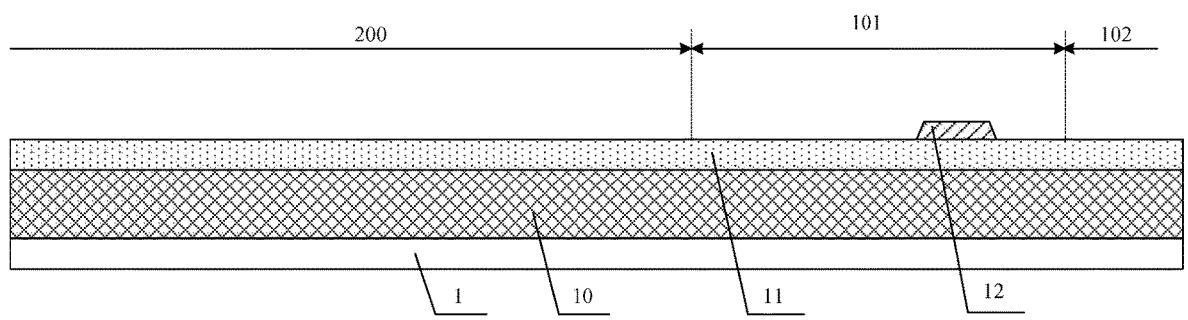
FIG. 6 is a schematic diagram of a display substrate after a first wiring layer is formed according to an embodiment of the present disclosure.

(2) Depositing a first metal thin film on the base substrate, and patterning the first metal thin film through a patterning process to form a pattern of a first wiring layer. As shown in FIG. 6, the pattern of the first wiring layer includes a gate line 12 located in the corner display region 101. After this process, there is no change in the film layer structures of the bezel region 200 and the blank corner cutting region 102, and they both include the first flexible material layer 10 and the first barrier layer 11.

Figure 7:
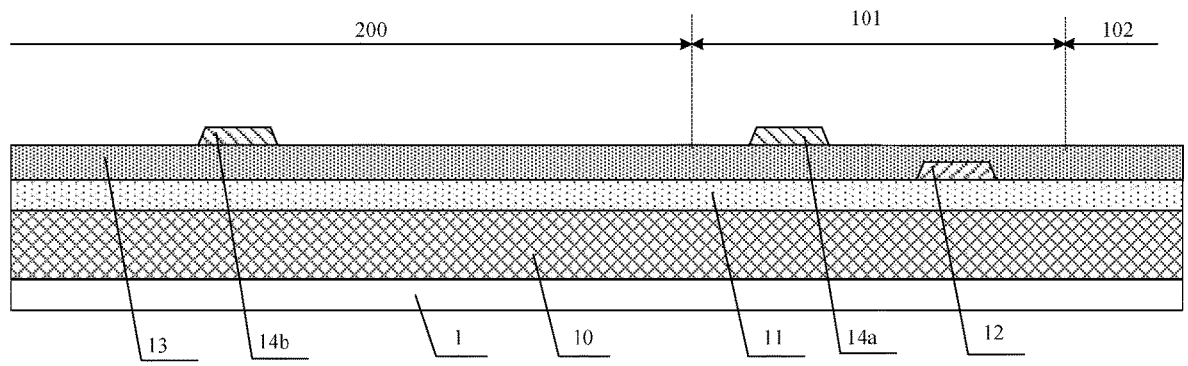
FIG. 7 is a schematic diagram of a display substrate after a second wiring layer is formed according to an embodiment of the present disclosure.

(3) Depositing a first insulating thin film and a second metal thin film on the base substrate where the aforementioned pattern is formed, and patterning the second metal thin film through a patterning process to form a first insulating layer 13 covering the whole base substrate and a pattern of a second wiring layer disposed on the first insulating layer 13. As shown in FIG. 7, the pattern of the second wiring layer includes a data line 14a located in the corner display region 101 and a power supply line 14b located in the bezel region 200. After this process, the blank corner cutting region 102 includes a base substrate and the first insulating layer 13 disposed on the base substrate.

Figure 8:
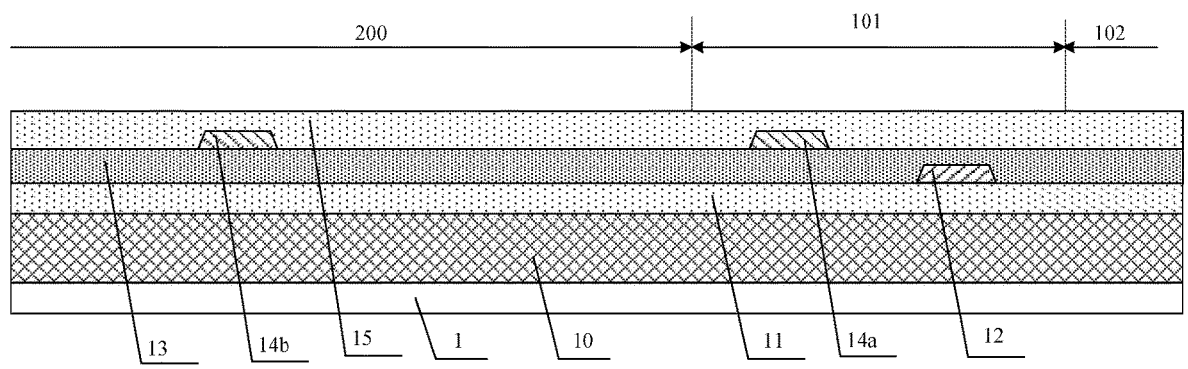
FIG. 8 is a schematic diagram of a display substrate after a second barrier layer is formed according to an embodiment of the present disclosure.

(4) Depositing a layer of second barrier thin film on the base substrate where the aforementioned pattern is formed to form a second barrier layer 15 covering the whole base substrate, as shown in FIG. 8.

Figure 9:
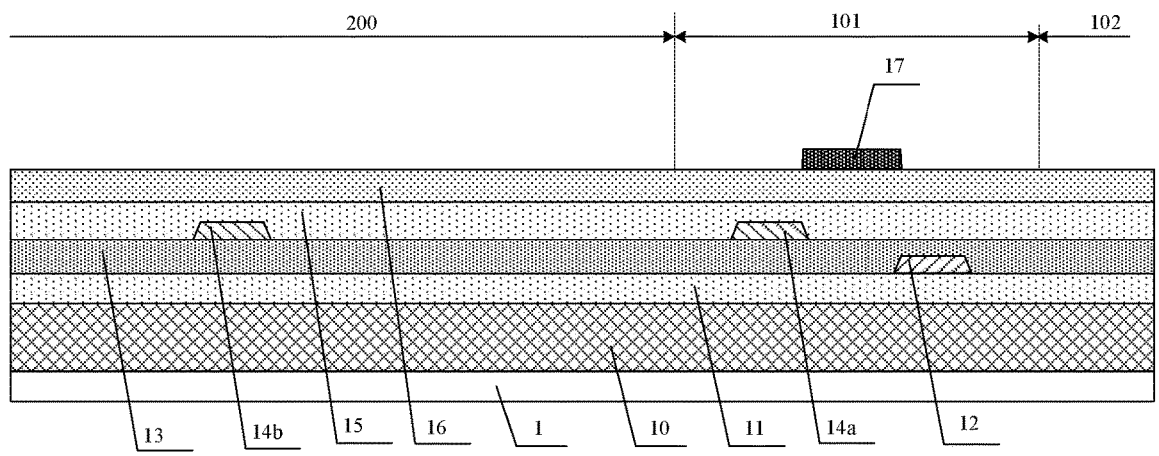
FIG. 9 is a schematic diagram of a display substrate after an active layer is formed according to an embodiment of the present disclosure.

(5) Sequentially depositing a second insulating thin film and a semiconductor thin film on the base substrate where the aforementioned pattern is formed, and patterning the semiconductor thin film through a patterning process to form a second insulating layer 16 covering the whole base substrate and a pattern of a semiconductor layer disposed on the second insulating layer 16, wherein the pattern of the semiconductor layer at least includes the active layer 17 located in the corner display region 101, as shown in FIG. 9.

Figure 10:
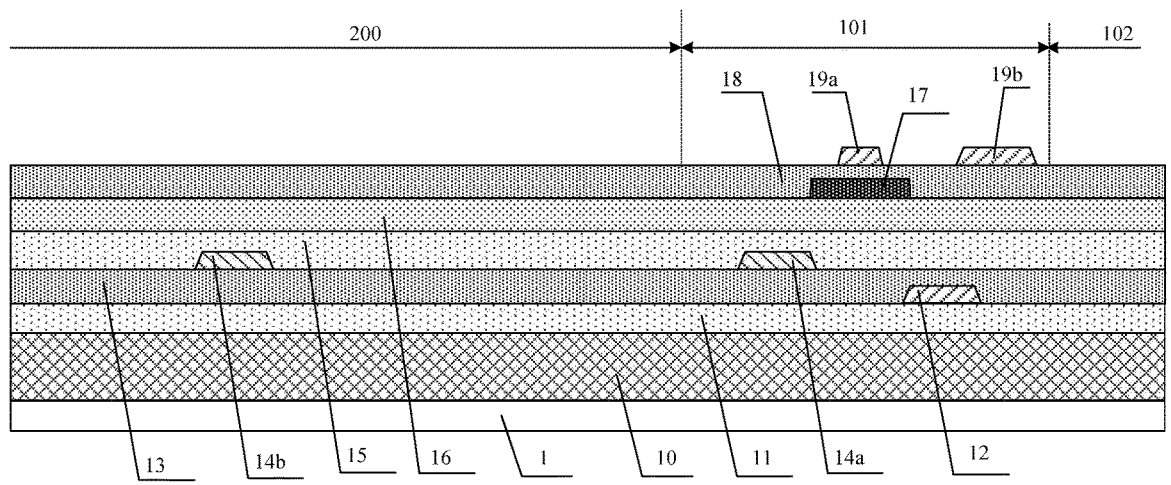
FIG. 10 is a schematic diagram of a display substrate after a first gate metal layer is formed according to an embodiment of the present disclosure.

(6) Sequentially depositing a third insulating thin film and a third metal thin film on the base substrate where the aforementioned pattern is formed, and patterning the third metal thin film through a patterning process to form a third insulating layer 18 covering the pattern of the active layer and a pattern of a first gate metal layer disposed on the third insulating layer 18. As shown in FIG. 10, the pattern of the first gate metal layer includes at least a first gate electrode 19a and a first capacitor electrode 19b formed in the display region 101.

Figure 11:
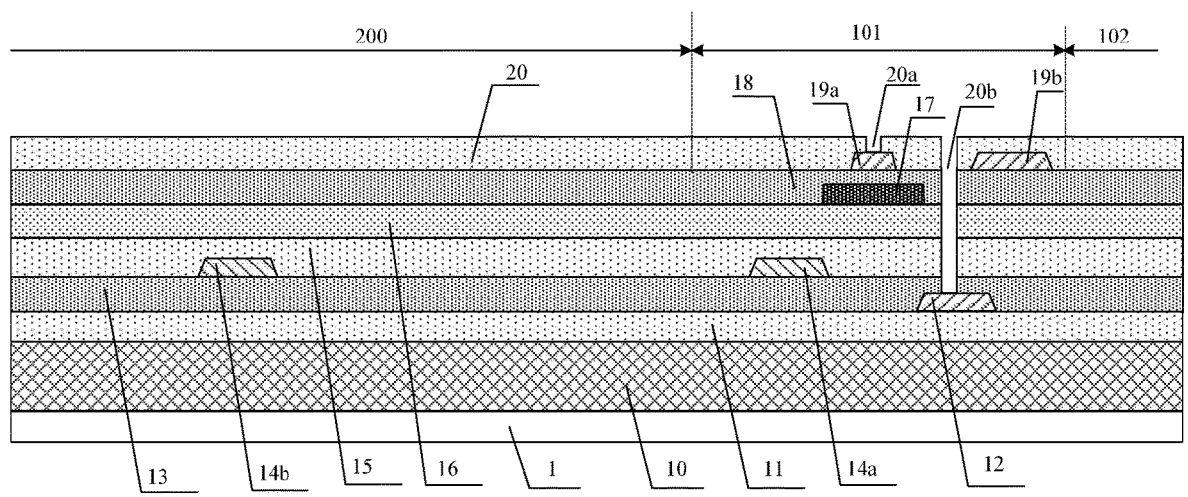
FIG. 11 is a schematic diagram of a display substrate after a fourth insulating layer is formed according to an embodiment of the present disclosure.

(7) Depositing a fourth insulating thin film on the base substrate where the aforementioned pattern is formed, and patterning the fourth insulating thin film through a patterning process to form a fourth insulating layer 20 pattern including a first via hole 20a and a second via hole 20b. As shown in FIG. 11, the first via hole 20a and the second via hole 20b are formed in the corner display region 101, and the fourth insulating layer 20 in the first via hole 20a is etched off to expose a surface of the gate electrode 19a. The fourth insulating layer 20, the third insulating layer 18, the second insulating layer 16, the second barrier layer 15 and the first insulating layer 13 in the second via hole 20b are etched off to expose a surface of the gate line 12.

Figure 12:
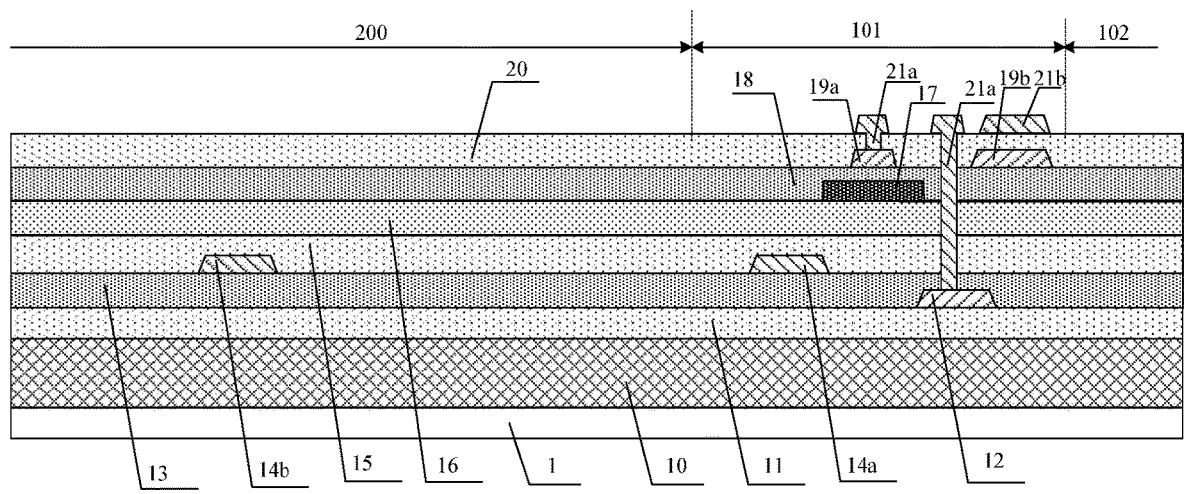
FIG. 12 is a schematic diagram of a display substrate after a second gate metal layer is formed according to an embodiment of the present disclosure.

(8) Depositing a fourth metal thin film on the base substrate where the aforementioned pattern is formed, and patterning the fourth metal thin film through a patterning process to form pattern of a second gate metal layer disposed on the fourth insulating layer 20. As shown in FIG. 12, the pattern of the second gate metal layer at least includes a first connection electrode 21a and a second capacitor electrode 21b located in the corner display region 101, the first connection electrode 21a is formed above the first via hole 20a and the second via hole 20b, the first connection electrode 21a is connected to the gate electrode 19a and the gate line, and the position of the second capacitor electrode 21b corresponds to the position of the first capacitor electrode 19b.

Figure 13:
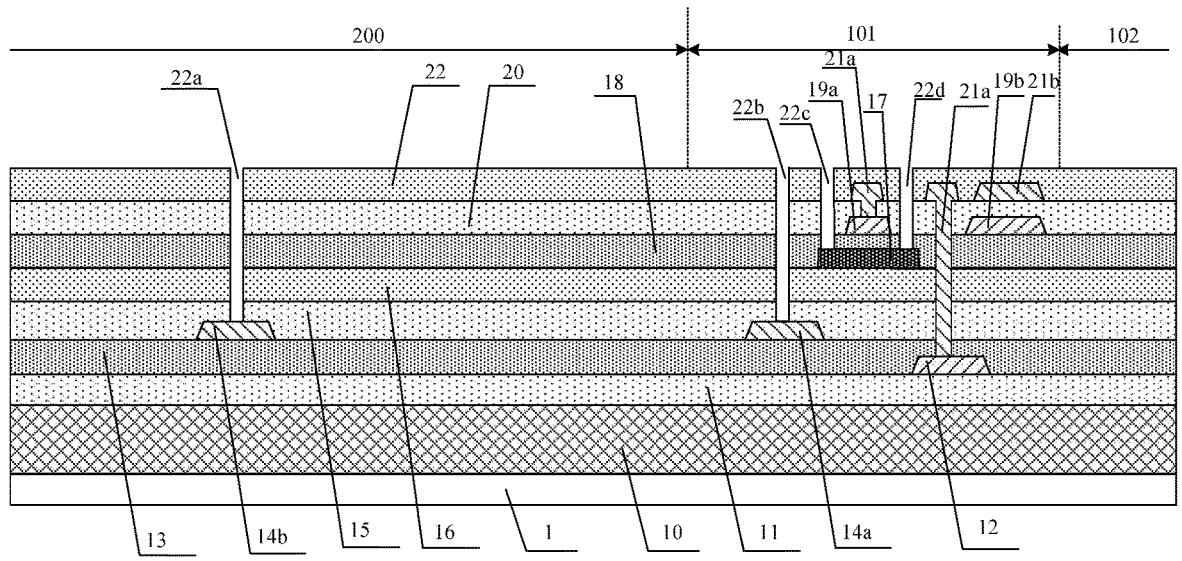
FIG. 13 is a schematic diagram of a display substrate after a fifth insulating layer is formed according to an embodiment of the present disclosure.

(9) Depositing a fifth insulating thin film on the base substrate where the aforementioned pattern is formed, and patterning the fifth insulating thin film through a patterning process to form a fifth insulating layer 22 including a third via hole 22a, a fourth via hole 22b, a fifth via hole 22c and a sixth via hole 22d. As shown in FIG. 13, the third via hole 22a is formed in the bezel region 200, and the fourth via hole 22b, the fifth via hole 22c and the sixth via hole 22d are formed in the corner display region 101. The fifth insulating layer 22, the fourth insulating layer 20, the third insulating layer 18, the second insulating layer 16 and the second barrier layer 15 in the third via hole 22a are etched off to expose a surface of the power supply line 14b. The fifth insulating layer 22, the fourth insulating layer 20, the third insulating layer 18, the second insulating layer 16 and the second barrier layer 15 in the fourth via hole 22b are etched off to expose a surface of the data line 14a. The fifth insulating layer 22, the fourth insulating layer 20 and the third insulating layer 18 in the fifth via hole 22c and the sixth via hole 22d are etched off to expose both ends of the active layer 17.

Figure 14:
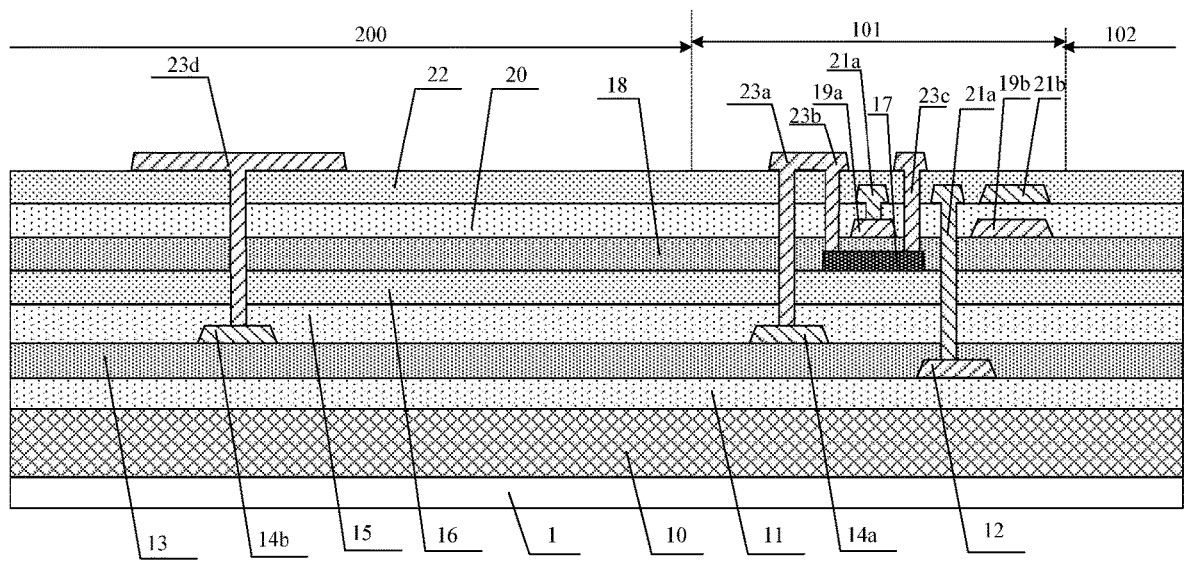
FIG. 14 is a schematic diagram of a display substrate after a first source and drain metal layer is formed according to an embodiment of the present disclosure.

(10) Depositing a fifth metal thin film on the base substrate where the aforementioned pattern is formed, and patterning the fifth metal thin film through a patterning process to form a pattern of a first source and drain metal layer disposed on the fifth insulating layer 22. As shown in FIG. 14, the pattern of the first source and drain metal layer at least includes a second connection electrode 23a, a source electrode 23b and a drain electrode 23c formed in the corner display region 101 and a third connection electrode 23d formed in the bezel region 200. The source electrode 23b is connected to one end of the active layer 17 through the fifth via hole 22c, the drain electrode 23c is connected to the other end of the active layer 17 through the sixth via hole 22d. One end of the second connection electrode 23a is formed on the fourth via hole 22b, and the other end of the second connection electrode 23a is connected to the source electrode 23b. The second connection electrode 23a is connected to the source electrode 23b and the data line 14a, the third connection electrode 23d is formed on the third via hole 22a, and the third connection electrode 23d is connected to the power supply line 14b.

The active layer 17, the gate electrode 19a, the source electrode 23b and the drain electrode 23c form a first transistor, and the first capacitor electrode 19b and the second capacitor electrode 21b form a storage capacitor. The first transistor may be the drive transistor T1 in the pixel drive circuit of FIG. 4, and the first storage capacitor may be the storage capacitor $C_{ST}$ in the pixel drive circuit of FIG. 4.

Figure 15:
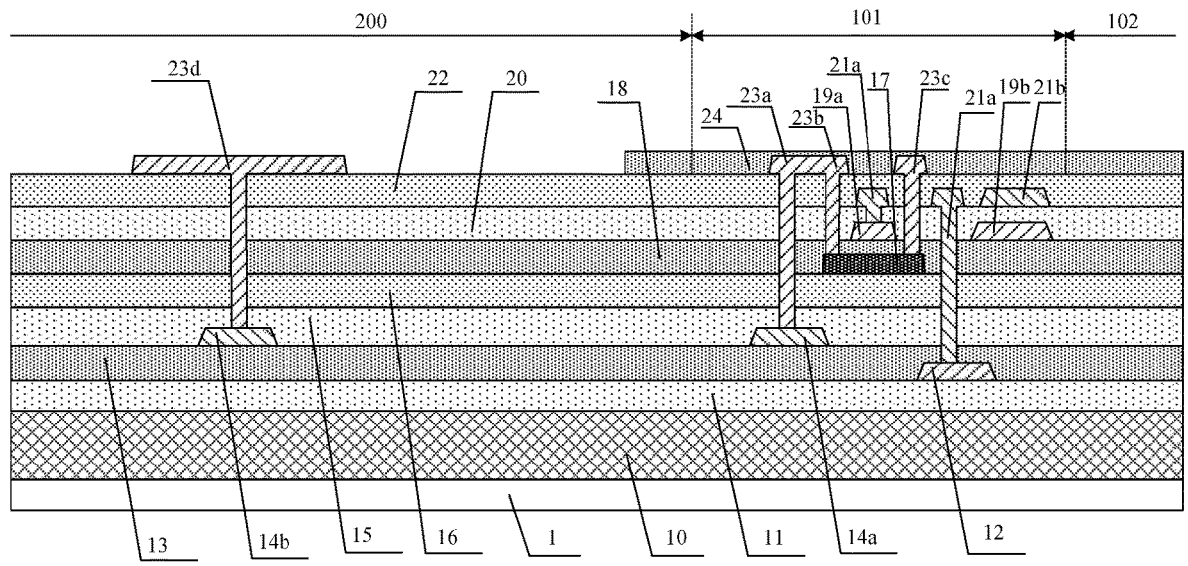
FIG. 15 is a schematic diagram of a display substrate after a passivation layer according is formed to an embodiment of the present disclosure.

(11) Depositing a sixth insulating thin film on the base substrate where the aforementioned pattern is formed, and patterning the sixth insulating thin film through a patterning process to form a pattern of a passivation layer 24. As shown in FIG. 15, the passivation layer 24 covers at least the second connection electrode 23a, the first source electrode 23b and the first drain electrode 23c in the corner display region 101. The passivation layer 24 above the third connection electrode 23d in the bezel region 200 is etched off to expose a surface of the third connection electrode 23d.

Figure 16:
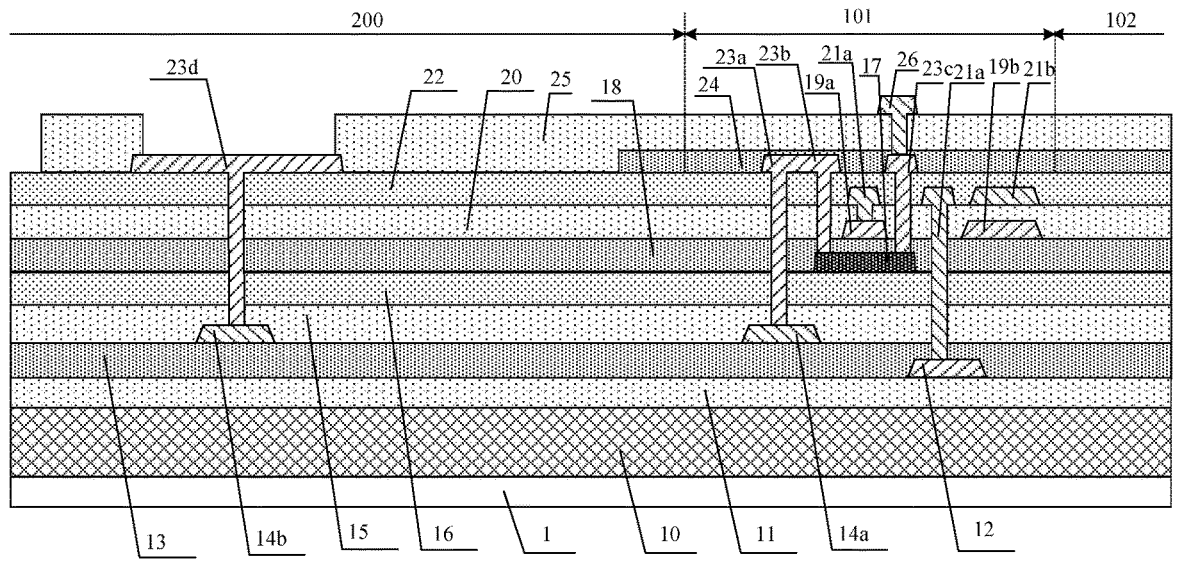
FIG. 16 is a schematic diagram of a display substrate after a metal conductive layer is formed according to an embodiment of the present disclosure.

(12) Coating a first planarization thin film and a sixth metal thin film on the base substrate where the aforementioned pattern is formed, and patterning the first planarization thin film and the sixth metal thin film through a patterning process to form a first planarization (PLN) layer 25 and a pattern of a metal conductive layer. As shown in FIG. 16, a seventh via hole and a first partition are formed on the first planarization layer 25. The seventh via hole is formed in the corner display region 101, and the first planarization layer 25 and passivation layer 24 in the seventh via hole are etched off to expose a surface of the drain electrode 23c. The first partition is formed in the bezel region 200, and the first planarization layer 25 in the first partition is removed to expose the surface of the third connection electrode. The pattern of the metal conductive layer includes a fourth connection electrode 26 located in the corner display region 101, wherein the fourth connection electrode 26 is formed above the seventh via hole and the fourth connection electrode 26 is connected to the drain electrode 23c.

Figure 17:
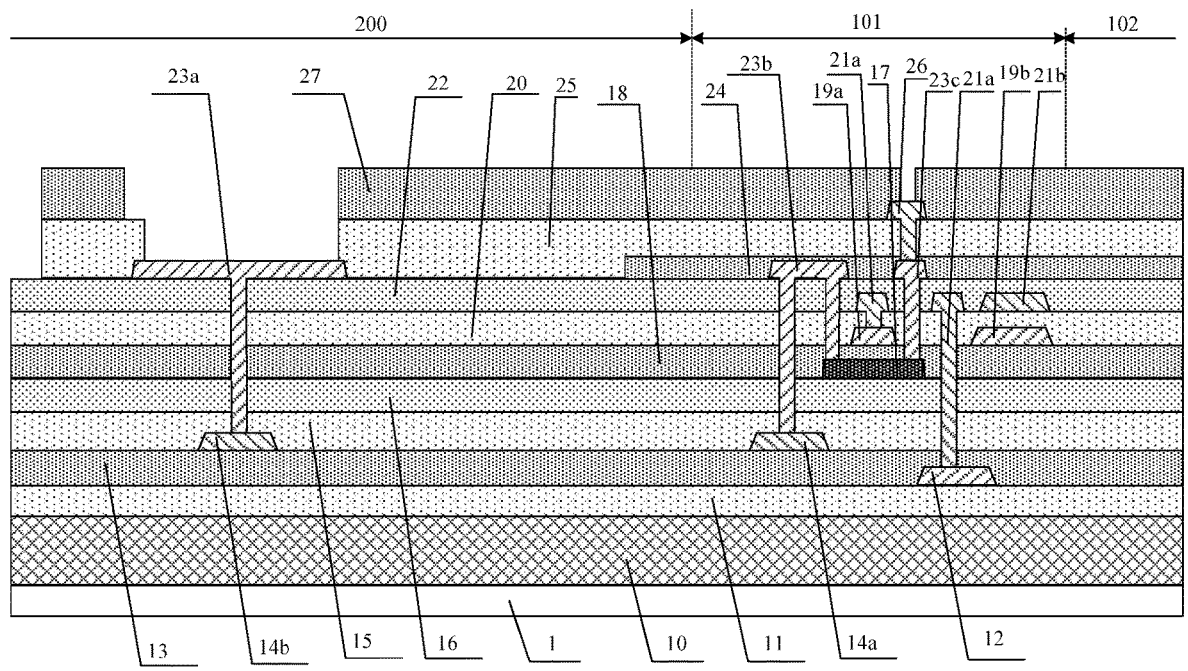
FIG. 17 is a schematic diagram of a display substrate after a second planarization layer is formed according to an embodiment of the present disclosure.

(13) Coating a second planarization thin film on the base substrate where the aforementioned pattern is formed, and patterning the second planarization thin film through a patterning process to form a second planarization layer 27. As shown in FIG. 17, an eighth via hole and a pattern of a second partition are formed on the second planarization layer 27, the eighth via hole is formed in the corner display region 101, and the second planarization layer 27 in the eighth via hole is etched off to expose the surface of a fourth connection electrode 26. The second partition is formed in the bezel region 200, and the second planarization layer 27 in the second partition is removed to expose a surface of the first partition.

Figure 18:
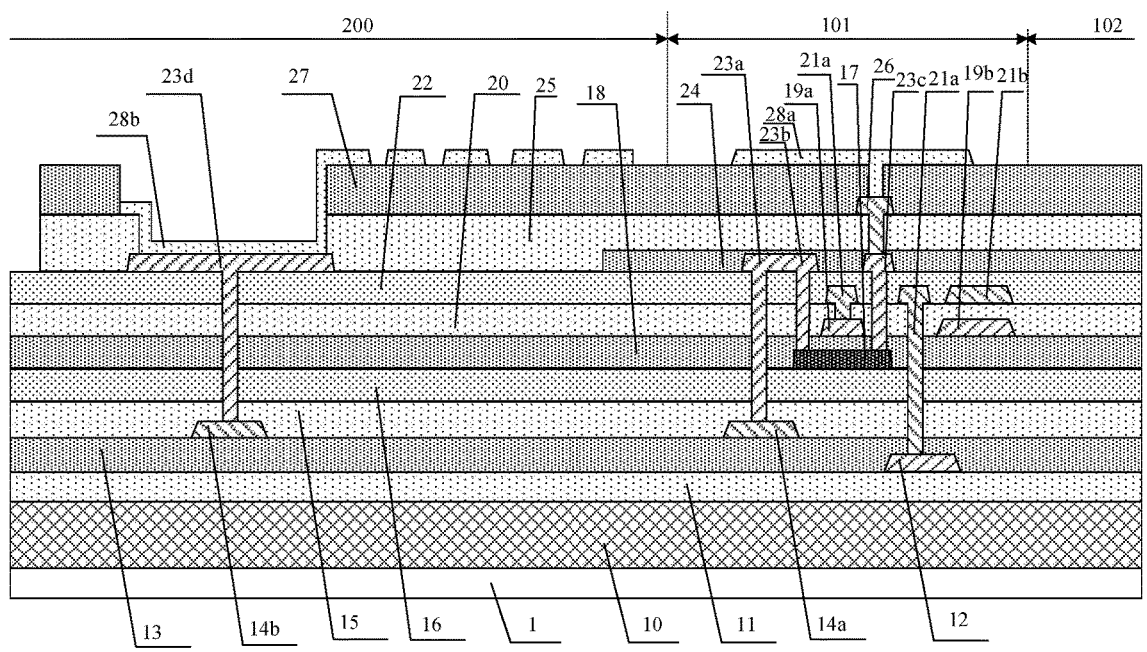
FIG. 18 is a schematic diagram of a display substrate after an anode and a fifth connection electrode are formed according to an embodiment of the present disclosure.

(14) Depositing a transparent conductive thin film on the base substrate where the aforementioned pattern is formed, and patterning the transparent conductive thin film through a patterning process to form a pattern of an anode 28*a* and a fifth connection electrode 28*b*. As shown in FIG. 18, the anode 28*a* is formed on the second planarization layer 27 of the corner display region 101 and is connected to the fourth connection electrode 26 through the eighth via hole. The fifth connection electrode 28*b* is formed in the bezel region 200, a part of the fifth connection electrode 28*b* is disposed in the first partition, the fifth connection electrode 28*b* is connected to the third connection electrode 23*d*, and multiple ninth via holes are formed on the fifth connection electrode 28*b* between the eighth via hole and the first partition.

Figure 19:
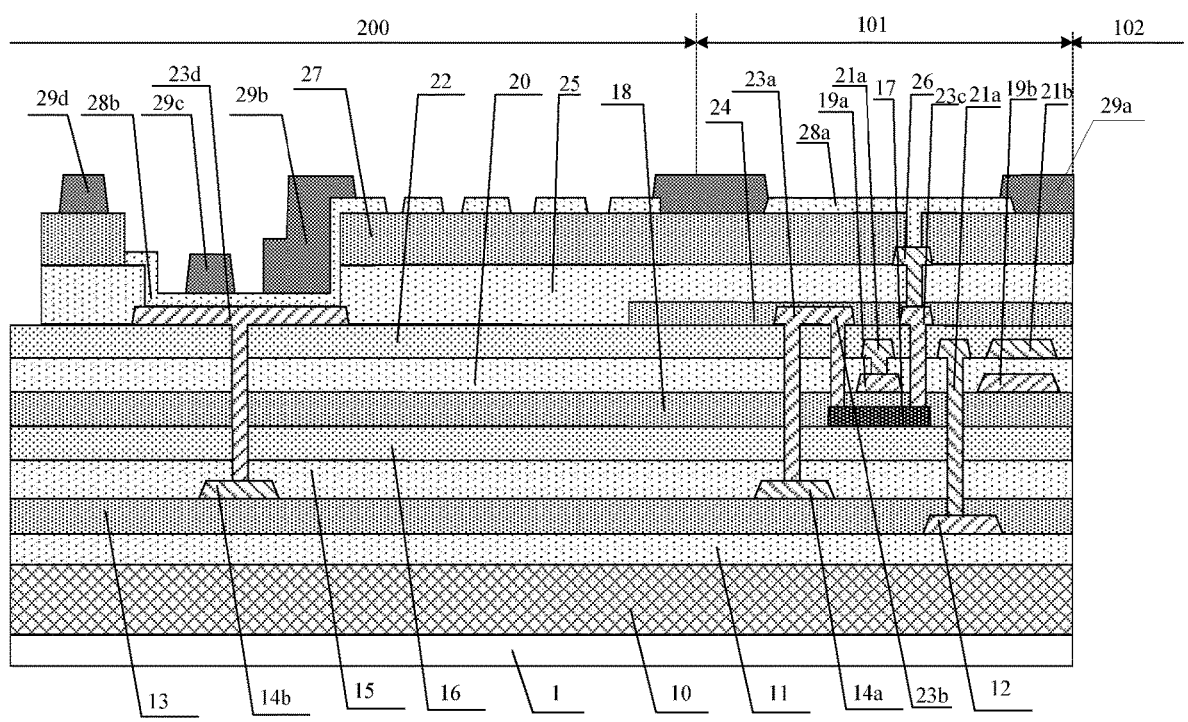
FIG. 19 is a schematic diagram of a display substrate after a pixel definition layer is formed according to an embodiment of the present disclosure.

(15) Coating a pixel definition thin film on the base substrate where the aforementioned pattern is formed, forming a pattern of a pixel definition layer (PDL) 29*a*, an isolation layer 29*b*, a first dam foundation 29*c* and a second dam foundation 29*d* through mask, exposure and development processes, and removing all the film layers in the blank corner cutting regions 102 by photolithography process to form a corner structure in which the corner display regions 101 and the blank corner cutting regions 102 are alternately disposed, as shown in FIG. 1. As shown in FIG. 19, the pixel definition layer 29*a* is formed in the corner display region 101, on which a pixel opening is provided, and the pixel definition thin film in the pixel opening is developed to expose a surface of the anode 28*a*. The isolation layer 29*b*, the first dam foundation 29*c* and the second dam foundation 29*d* are formed in the bezel region 200. One end of the isolation layer 29*b* is formed on the fifth connection electrode 28*b* in the first partition and the other end of the isolation layer is formed on the fifth connection electrode 28*b* between the ninth via holes and the first partition. The first dam foundation 29*c* is disposed on the fifth connection electrode 28*b* in the first partition, and the second dam foundation 29*d* is disposed on the second planarization layer 27 on a side of the first dam foundation 29*c* away from the corner display region 101, wherein the first dam foundation 29*c* and the second dam foundation 29*d* are configured to form two isolation dams.

In an exemplary embodiment, an edge of the blank corner cutting region 102 facing the bezel region 200 is a first arc, and an edge of the corner display region 101 facing the bezel region 200 is a second arc, wherein the first arc and the second arc are located on a circle with a same center and a same radius.

In an exemplary embodiment, an arc length of the first arc is about 18 to 35 microns, and an arc length of the second arc is about 180 to 250 microns.

Figure 20:
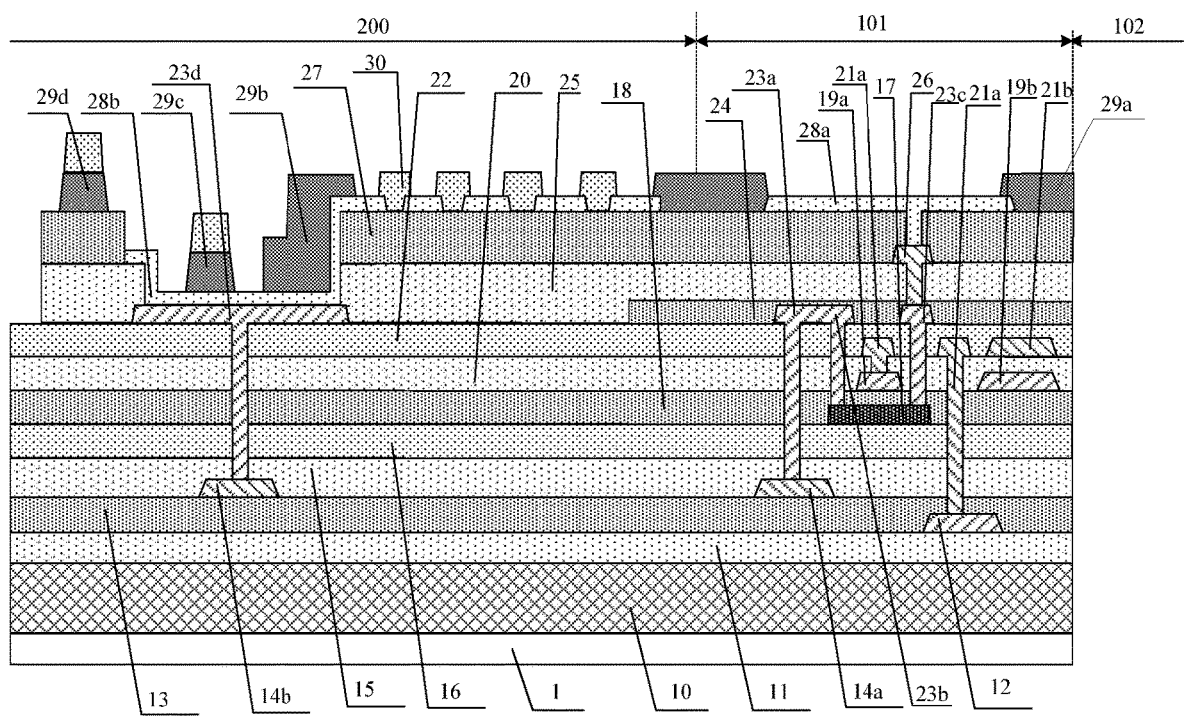
FIG. 20 is a schematic diagram of a display substrate after forming pillar spacers according to an embodiment of the present disclosure.

(16) Coating an organic material thin film on the base substrate where the aforementioned pattern is formed, and forming a pattern of multiple pillar spacers (PS) 30 in the bezel region 200 through mask, exposure and development processes. As shown in FIG. 20, the pillar spacers 30 are disposed above all of the first dam foundation 29*c*, the second dam foundation 29*d* and the ninth via holes, and the fifth connection electrode 28*b* is exposed between the multiple pillar spacers 30 on the multiple ninth via holes.

Figure 21:
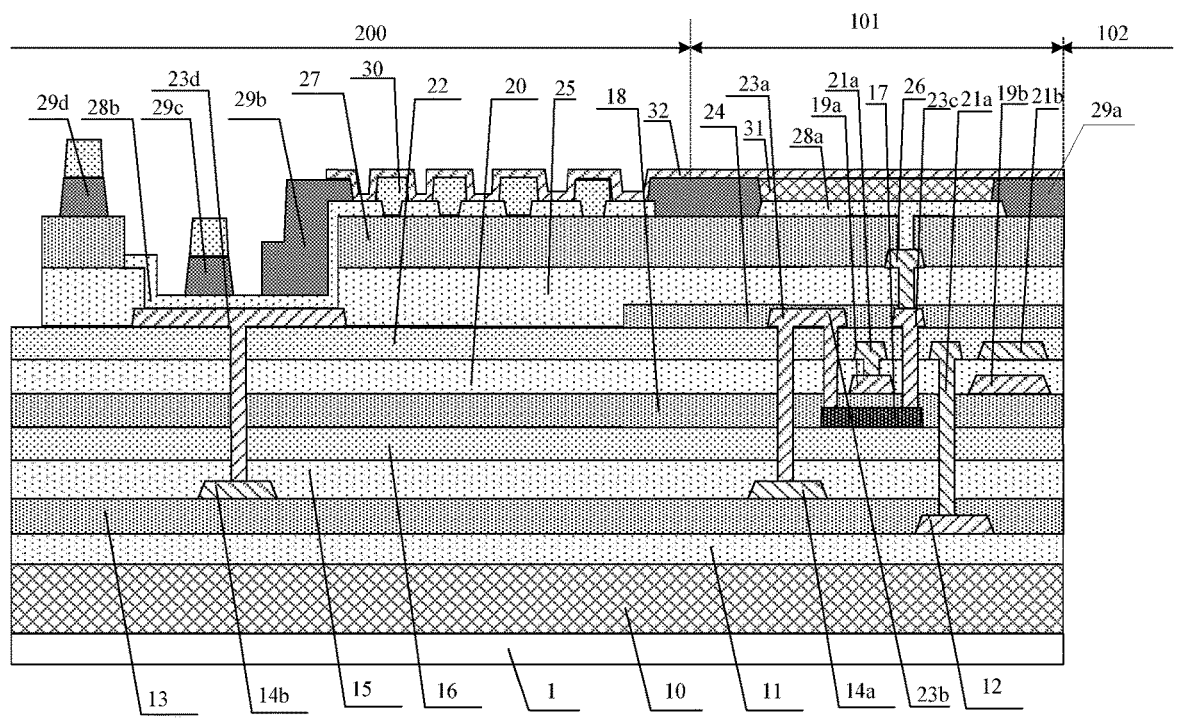
FIG. 21 is a schematic diagram of a display substrate after an organic light-emitting layer and a cathode are formed according to an embodiment of the present disclosure.

(17) Sequentially forming an organic light-emitting layer 31 and a cathode 32 on the base substrate where the aforementioned pattern is formed. As shown in FIG. 21, the organic light-emitting layer 31 is formed in the pixel opening of the corner display region 101, so that connection between the organic light-emitting layer 31 and the anode 28*a* is achieved. Since the anode 28*a* is connected to the fourth connection electrode 26, and the fourth connection electrode 26 is connected to the first drain electrode 23*c* of the first transistor, connection between the organic light-emitting layer 31 and the first drain electrode 23*c* of the first transistor is achieved. A part of the cathode 32 is formed on the organic light-emitting layer 31 in the corner display region 101 and the cathode 32 is connected to the organic light-emitting layer 31, and another part of the cathode 32 is formed in the bezel region 200. The cathode 32 wraps the multiple pillar spacers 30, and the cathode 32 is connected to the fifth connection electrode 28*b* exposed between the multiple pillar spacers 30. Since the cathode 32 is connected to the fifth connection electrode 28*b*, the fifth connection electrode 28*b* is connected to the third connection electrode 23*d*, and the third connection electrode 23*d* is connected to the power supply line 14*b*, connection between the cathode 32 and the power supply line 14*b* is thereby achieved. In an exemplary embodiment, the organic light-emitting layer 31 may include a hole injection layer, a hole transmission layer, a light-emitting layer, an electron transmission layer and an electron injection layer which are stacked, and the cathode 32 may adopt any one or more of magnesium (Mg), silver (Ag), aluminum (Al), copper (Cu) and lithium (Li), or an alloy made of any one or more of the above metals.

Figure 22:
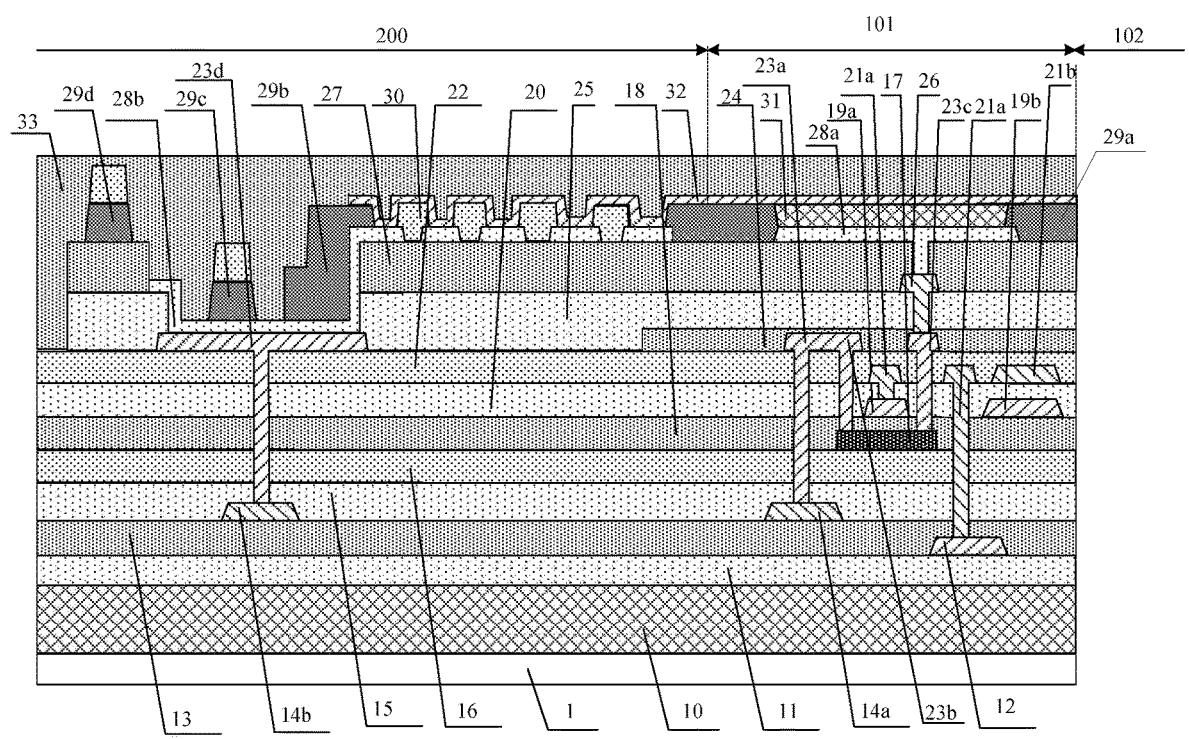
FIG. 22 is a schematic diagram of a display substrate after an encapsulation layer is formed according to an embodiment of the present disclosure.

(18) Forming an encapsulation layer 33 on the base substrate where the aforementioned pattern is formed, wherein the encapsulation layer 33 is formed in the bezel region 200 and the corner display region 101, as shown in FIG. 22. The encapsulation layer 33 of the corner display region 101 may adopt a stacked structure of inorganic material/organic material/inorganic material, and the organic material layer is disposed between the two inorganic material layers, and the encapsulation layer 33 of the bezel region 200 may adopt a stacked structure of inorganic material/inorganic material.

In an exemplary embodiment, the process for preparing the display substrate may further include: peeling the display substrate from the glass carrier plate 1 through a peeling process, bonding a layer of back film to the back surface of the display substrate (a side surface of the base substrate away from the film layers) by a method of roller bonding, and the formed display substrate is shown in FIGS. 1 and 2.

In an embodiment of the present disclosure, each of the first insulating thin film, the second insulating thin film, the third insulating thin film, the fourth insulating thin film, the fifth insulating thin film, and the sixth insulating thin film may adopt any one or more of silicon oxide (SiOx), silicon nitride (SiNx) and silicon oxynitride (SiON), and may be a single layer, multiple layers or a composite layer. The second insulating layer is called a buffer layer, which is used for improving the moisture and oxygen resistance of the base substrate, the third and fourth insulating layers are called gate insulating (GI) layers, and the fifth insulating layer is called an interlayer insulating (ILD) layer. Organic materials may be used as the first planarization layer and the second planarization layer. The first metal thin film, the second metal thin film, the third metal thin film, the fourth metal thin film, the fifth metal thin film, and the sixth metal thin film may adopt metal materials, such as any one or more of silver (Ag), copper (Cu), aluminum (Al) and molybdenum (Mo), or alloy materials of the above metals, such as AlNd alloy or MoNb alloy, which may have a single-layer structure or a multi-layer composite structure, such as Mo/Cu/Mo. The cathode 32 may adopt any one or more of magnesium (Mg), silver (Ag), aluminum (Al), copper (Cu) and lithium (Li), or an alloy made of any one or more of the above metals. The active layer thin film may use various materials such as amorphous indium gallium zinc Oxide (a-IGZO), zinc oxynitride (ZnON), indium zinc tin oxide (IZTO), amorphous silicon (a-Si), polysilicon (p-Si), hexathiophene, polythiophene, or the like, that is, embodiments of the present disclosure is applicable to transistors manufactured based on an Oxide technology, a silicon technology and an organic technology. The transparent conductive thin film may adopt indium tin oxide (ITO) or indium zinc oxide (IZO), and the pixel definition layer may adopt polyimide, acrylic or polyethylene terephthalate, etc.

In an exemplary embodiment, the process for preparing of the display substrate shown in FIG. 3 can be substantially the same as that of the previous exemplary embodiments, except that after the pattern of the second wiring layer is formed through the patterning process, a seventh insulating layer 34 and a second flexible material layer 35 are formed to cover the whole base substrate. At this time, the first flexible material layer 10, the first barrier layer 11, the seventh insulating layer 34, the second flexible material layer 35 and the second barrier layer 15 form a double-layer base substrate, and the first wiring layer 12, the first insulating layer 13 and the second wiring layer are disposed in the double-layer base substrate. The material of the second flexible material layer 35 may adopt polyimide (PI), polyethylene terephthalate (PET) or a polymer soft film after surface treatment, and the material of the seventh insulating layer 34 may adopt amorphous silicon (a-si).

The description of the structure and process for preparing of the display substrate according to embodiments of the present disclosure is merely illustrative. In an exemplary embodiment, corresponding structures may be changed and patterning processes may be added or reduced according to actual needs, the disclosure is not limited here.

It can be seen from the process for preparing of an exemplary embodiment of the present disclosure that, according to the display substrate provided by the embodiment of the disclosure, by disposing the composite wiring layer below the drive structure layer, the signal wiring in the corner display regions 101 can be routed from below the light-emitting element, and there is no signal wiring in the blank corner cutting regions 102 at the corner position. When the cover plate is bonded, the blank corner cutting regions 102 are compressed, and the corner display regions 101 are in contact with each other to form a whole, which effectively eliminates wrinkles formed by compression. Metal wiring and inorganic layers in the display substrate will not break, thus improving display quality. Exemplary embodiments of the disclosure shows that the process for preparing of the base substrate has good process compatibility, simple process realization, easy implementation, high production efficiency, low production cost and high yield rate.

An embodiment of the present disclosure further provides a method for preparing a display substrate including a display region and a bezel region, wherein the display region includes multiple corner regions, and at least one of the multiple corner regions includes a corner display region and a blank corner cutting region which are alternately disposed. In an exemplary embodiment, the preparation method includes:

Step S1, forming a composite wiring layer on a base substrate, wherein the composite wiring layer of the corner display region includes a first wiring layer, a second wiring layer and a first insulating layer disposed between the first wiring layer and the second wiring layer, wherein the first wiring layer includes a gate line and the second wiring layer includes a data line;

Step S2, forming a drive structure layer on the composite wiring layer, wherein the drive structure layer of the corner display region includes a pixel drive circuit and multiple connection electrodes;

Step S3, forming a light-emitting element on the drive structure layer, removing all film layer structures in the blank corner cutting region, wherein the gate line, the data line, and the light-emitting element are connected to the pixel drive circuit through the multiple connection electrodes.

In an exemplary embodiment, the pixel drive circuit includes a first transistor. The multiple connection electrodes include a first connection electrode, a second connection electrode and a fourth connection electrode. The light-emitting element includes an anode, a cathode and an organic light-emitting layer disposed between the anode and the cathode. The bezel region includes a power supply line, a third connection electrode and a fifth connection electrode.

The drive structure layer includes a second insulating layer disposed on the composite wiring layer, an active layer disposed on the second insulating layer, a third insulating layer covering the active layer, a first gate metal layer disposed on the third insulating layer, a fourth insulating layer covering the first gate metal layer, a second gate metal layer disposed on the fourth insulating layer, a fifth insulating layer covering the second gate metal layer, a first source and drain metal layer disposed on the fifth insulating layer, a passivation layer disposed on the first source and drain metal layer, a first planarization layer disposed on the passivation layer, a metal conductive layer on the planarization layer, and a second planarization layer disposed on the metal conductive layer;

wherein the power supply line is disposed on the first wiring layer or the second wiring layer;

the first connection electrode is disposed on the second gate metal layer and is connected to the gate line and a gate electrode of the first transistor;

the second connection electrode and the third connection electrode are disposed on the first source and drain metal layer, the second connection electrode is connected to the data line and a source electrode of the first transistor, and the third connection electrode is connected to the power supply line and the fifth connection electrode;

the fourth connection electrode is disposed on the metal conductive layer and is connected to the anode and a drain electrode of the first transistor;

the fifth connection electrode is disposed in a same layer as the anode, and is connected to the third connection electrode and a cathode.

According to the method for preparing the display substrate provided by the embodiment of the disclosure, by disposing the composite wiring layer below the drive structure layer, the signal wiring in the corner display region can be routed from below the light-emitting element, and there is no signal wiring in the blank corner cutting regions at the corner position. When the cover plate is bonded, the blank corner cutting regions are compressed, and the corner display regions are in contact with each other to form a whole, which effectively eliminates wrinkles formed by compression, and metal wiring and inorganic layers in the display substrate will not break, thus improving display quality. Exemplary embodiments of the disclosure shows that the process for preparing of the base substrate has good process compatibility, simple process realization, easy implementation, high production efficiency, low production cost and high yield rate.

An embodiment of the present disclosure further provides a display apparatus which includes any one of the aforementioned display substrates. The display apparatus may be any product or component with a display function such as a mobile phone, a tablet computer, a television, a display, a laptop computer, a digital photo frame, or a navigator, etc.

An embodiment of the present disclosure further provides a method for bonding a display panel, wherein structure of the display panel is the same as that of the display substrate described above. As shown in FIGS. 23-28, a display panel 7 includes a display region 100 and a bezel region 200, the display region 100 includes multiple corner regions, and at least one of the multiple corner regions includes a corner display region 101 and a blank corner cutting region 102 which are alternately disposed. In an exemplary embodiment, the bonding method includes:

Step S1', forming an optical adhesive (OCA) layer 2 on a side of the display panel 7 facing a cover plate 5, wherein the optical adhesive layer 3 includes multiple first fan-shaped regions 201 and first opening regions 202 which are alternately disposed; an orthographic projection of the corner display region 101 on the display panel 7 includes an orthographic projection of the first fan-shaped regions 201 on the display panel 7, and an orthographic projection of the first opening region 202 on the display panel 7 includes an orthographic projection of the blank corner cutting region 102 on the display panel 7;

Step S2', bonding a back film 3 on a side of the display panel 7 away from the cover plate 5;

Step S3', pulling the display panel 7 through a carrier film 4 for copying;

Step S4', bonding the display panel 7 with the cover plate 5, and removing the carrier film 4.

In an exemplary embodiment, the back film 3 includes multiple second fan-shaped regions 301 and second opening regions 302 which are alternately disposed. An orthographic projection of the corner display region 101 on the display panel 7 includes an orthographic projection of the second fan-shaped region 301 on the display panel 7, and an orthographic projection of the second opening regions 302 on the display panel 7 includes an orthographic projection of the blank corner cutting regions 102 on the display panel 7.

The carrier film 4 includes multiple third fan-shaped regions 401 and third opening regions 402 which are alternately disposed. An orthographic projection of the corner display region 101 on the display panel 7 includes an orthographic projection of the third fan-shaped regions 401 on the display panel 7, and an orthographic projection of the third opening regions 402 on the display panel 7 includes the orthographic projection of the blank corner cutting regions 102 on the display panel 7.

Figure 23:
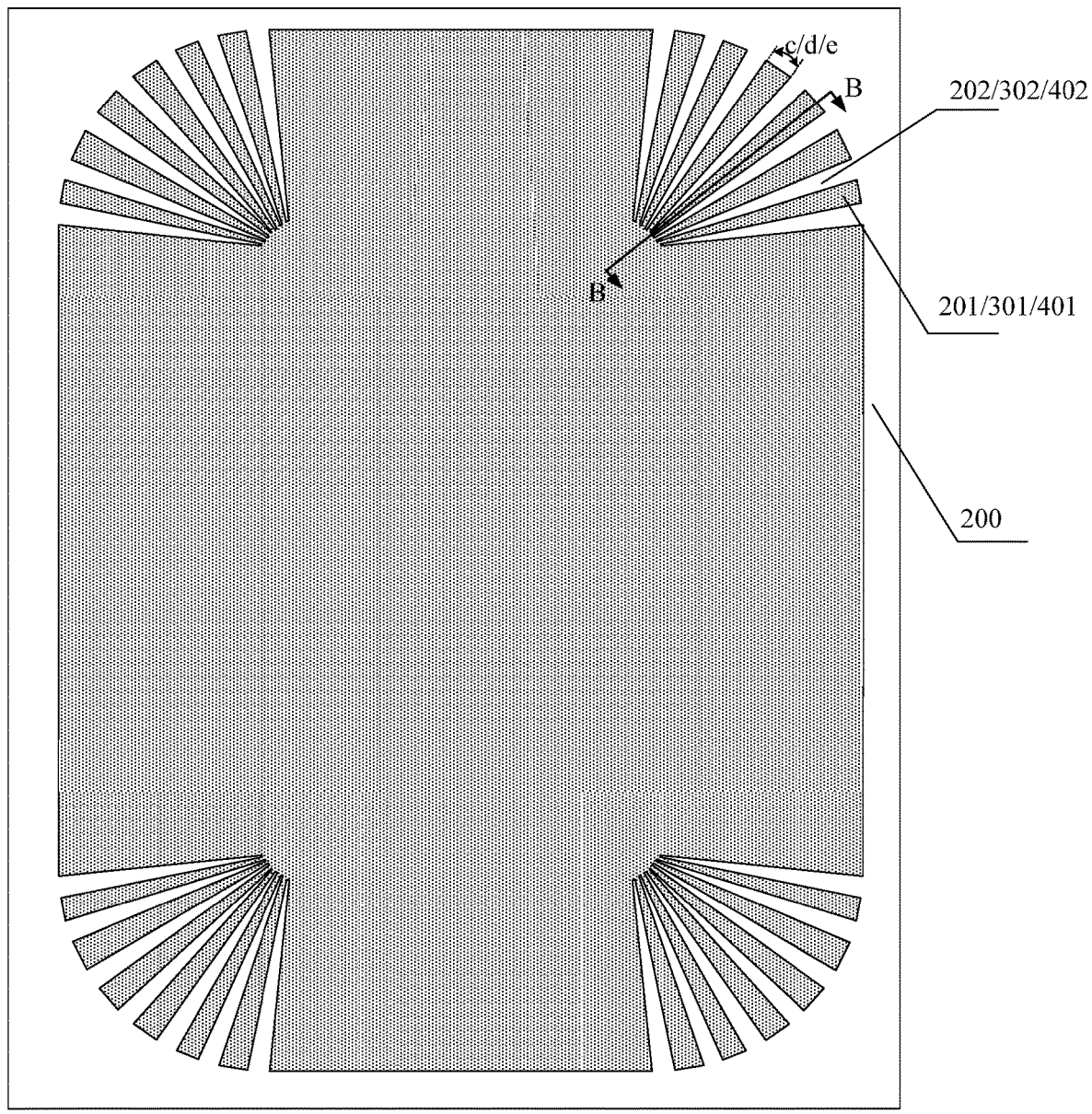
FIG. 23 is a schematic diagram of a plane structure of a display panel according to an embodiment of the present disclosure.
Figure 24:
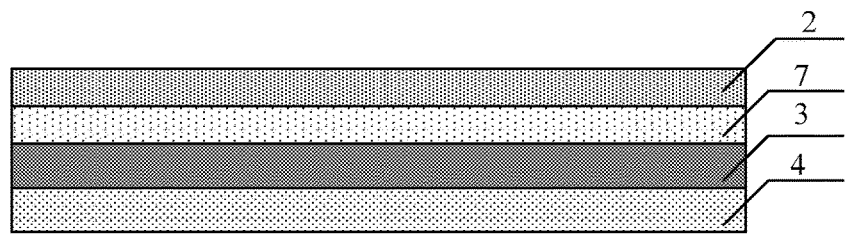
FIG. 24 is a schematic diagram of a cross-sectional structure of the display panel shown in FIG. 23 in BB direction.

In an exemplary embodiment, an edge of the corner display region 101 facing the bezel region 200 is a second arc b;

an edge of a first fan-shaped region 201 facing the bezel region 200 is a third arc, and an arc length c of the third arc is smaller than an arc length b of the second arc by 20 microns to 50 microns;

an edge of a second fan-shaped region 301 facing the bezel region 200 is a fourth arc, and an arc length d of the fourth arc is smaller than the arc length b of the second arc by 20 microns to 50 microns; and an edge of a third fan-shaped region 401 facing the bezel region 200 is a fifth arc, and an arc length e of the fifth arc is smaller than the arc length b of the second arc by 20 microns to 50 microns;

In this exemplary embodiment, in order to achieve compressibility of the four corners of the flexible screen during bonding in a module (MDL) stage, the optical adhesive layer 2 above the display panel 7 and the back film 3 and carrier film 4 on the back of the display panel 7 all adopt a fan-shaped design at the four corners to avoid interference and compression during the bonding. Widths of the fan-shaped regions of the materials (including the optical adhesive layer 2 above the display panel 7 and the back film 3 and the carrier film 4 on the back of the display panel 7) are all 20 to 50 um smaller than the fan-shaped width of the corner regions of the display panel 7. The four corner structures and cross-sections of the optical adhesive layer 2, the back film 3 and the carrier film 4 are shown in FIGS. 23 and 24.

In another exemplary embodiment, the back film 3 includes fourth opening regions 303, and an orthographic projection of the fourth opening regions 303 on the display panel 7 includes the orthographic projection of the corner regions on the display panel 7.

The carrier film 4 includes fifth opening regions 403, and an orthographic projection of the fifth opening regions 403 on the display panel 7 includes the orthographic projection of the corner regions on the display panel 7.

Figure 25:
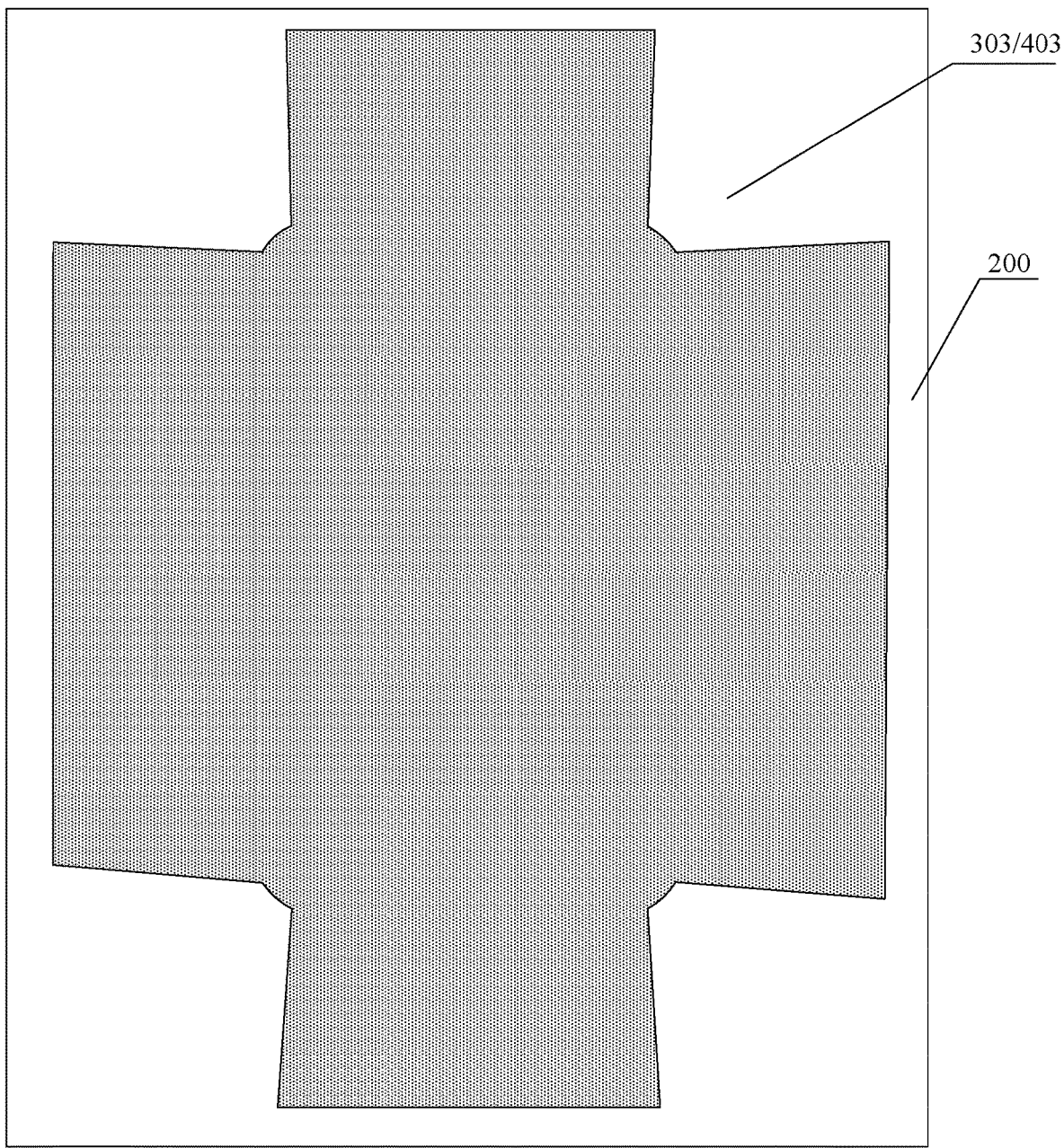
FIG. 25 is a schematic diagram of a plane structure of a back film and a carrier film of a display panel according to an embodiment of the present disclosure.
Figure 26:
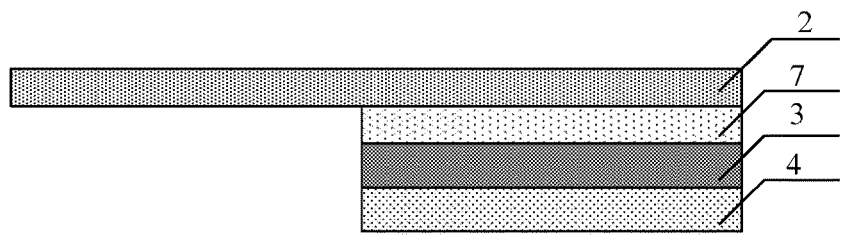
FIG. 26 is another schematic diagram of a cross-sectional structure of the display panel shown in FIG. 23 in BB direction.

In this exemplary embodiment, in order to achieve the compressibility of the four corners of the flexible screen during the bonding in the module stage, the optical adhesive layer 2 above the display panel 7 adopts a fan-shaped design at the four corners, and the fan-shaped width of the optical adhesive layer 2 is 20-50 um smaller than the fan-shaped width of the corner regions of the display panel 7. The bottom of the corner regions of the display panel 7 adopts a design without back film. The carrier film and the back film are only bonded to the main display region (i.e., the non-corner region). The reduction of the film layer in the fan-shaped regions makes it easier to splice the sectors together. A structure of the four corners of the optical adhesive layer 2 is shown in FIG. 23, a structure of the four corners of the back film 3 and the carrier film 4 is shown in FIG. 25, and the cross sections of the optical adhesive layer 2, the back film 3 and the carrier film 4 are shown in FIG. 26.

Figure 27:
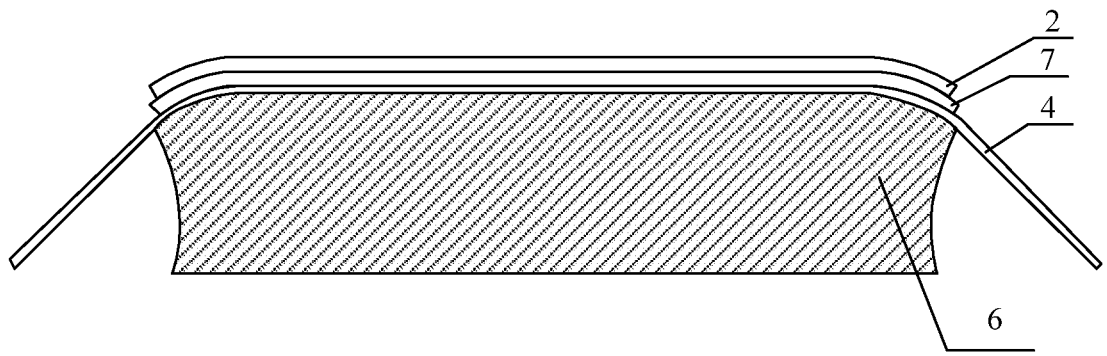
FIG. 27 is a schematic diagram of a principle of copying of the display panel shown in FIG. 23.
Figure 28:
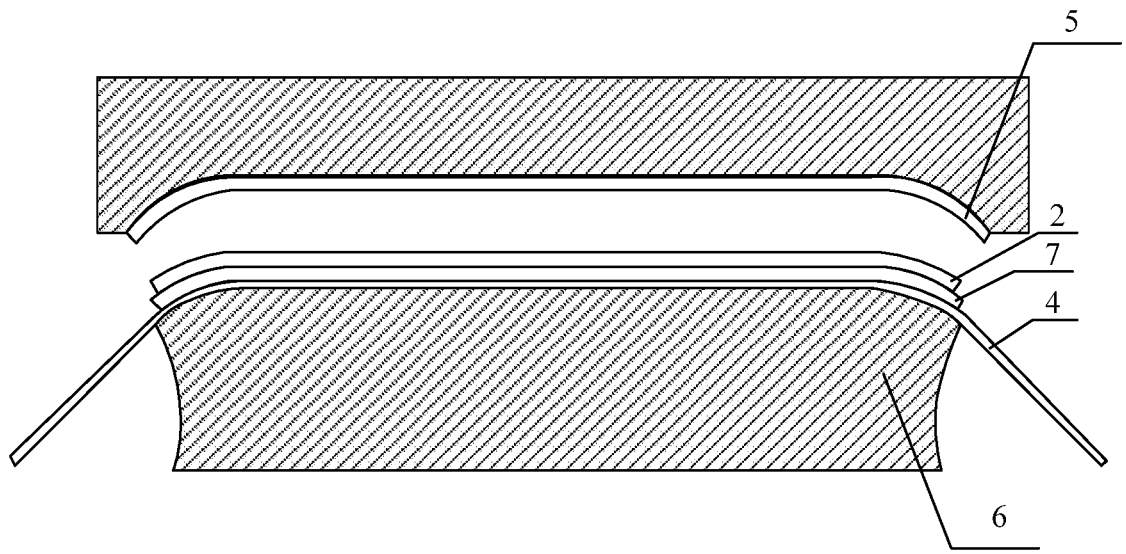
FIG. 28 is a schematic diagram of a principle of bonding of the display panel shown in FIG. 23.

As shown in FIG. 27, the structure of the above two solutions is copied on a silica gel pad 6 with the flexible screen pulled by the carrier film. During the copying, the four corners are compressed, and the corner cutting regions of the fan-shaped regions are compressed and the width is reduced. Finally, the display regions of the fan-shaped regions are in contact with each other to form a whole. The fan-shaped structure formed by PI etching in the four corners is compressed and spliced during bending deformation, which effectively eliminates the wrinkles formed by the compression. As shown in FIG. 28, the flexible screen in the copying state is bonded to the four-sided curved cover plate to achieve a four-sided curved full display.

According to the method for bonding the display panel provided by the embodiment of the present disclosure, by etching the four corners of the flexible screen into a fan-shaped structure, multiple blank corner cutting regions 102 are formed. When the cover plate is bonded, the blank corner cutting regions 102 are compressed, and the corner display regions 101 are spliced with each other to form a whole, so that the area of the four corners of the flexible screen is equal to the area of four corners of a glass cover. In order to achieve splicing without bezel, exemplary embodiments of the present disclosure uses a method of wiring data lines, gate lines and power supply lines from below pixel units in the display region, so that no wiring is required between adjacent fan-shaped regions, thereby achieving the splicing without bezel between adjacent fan-shaped regions and enhancing the display effect.

Although the embodiments disclosed in the present disclosure are as described above, the described contents are only the embodiments for facilitating understanding of the present disclosure, which are not intended to limit the present disclosure. A person skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

What is claimed is:

1. A display substrate, comprising a display region and a bezel region, wherein the display region comprises a plurality of corner regions, and at least one of the plurality of corner regions comprises a corner display region and a blank corner cutting region which are alternately disposed;
   the corner display region comprises a composite wiring layer disposed on a base substrate, a drive structure layer disposed on the composite wiring layer and a light-emitting element disposed on the drive structure layer; the composite wiring layer comprises a first wiring layer, a second wiring layer and a first insulating layer disposed between the first wiring layer and the second wiring layer; the drive structure layer comprises a pixel drive circuit and a plurality of connection electrodes; and
   the first wiring layer comprises a gate line, and the second wiring layer comprises a data line, wherein the gate line, the data line and the light-emitting element are connected to the pixel drive circuit through the plurality of connection electrodes.

2. The display substrate according to claim 1, wherein the pixel drive circuit comprises a first transistor, the plurality of connection electrodes comprise a first connection electrode, a second connection electrode and a fourth connection electrode, the light-emitting element comprises an anode, a cathode and an organic light-emitting layer disposed between the anode and the cathode; and
   the first connection electrode is connected to the gate line and a gate electrode of the first transistor, the second connection electrode is connected to the data line and a source electrode of the first transistor, and the fourth connection electrode is connected the anode and a drain electrode of the first transistor.

3. The display substrate according to claim 2, wherein the bezel region comprises a power supply line, a third connection electrode, and a fifth connection electrode,
   wherein the power supply line is disposed on the first wiring layer or the second wiring layer, the third connection electrode is disposed in a same layer as the source electrode and the drain electrode of the first transistor, and the fifth connection electrode and the anode are disposed in a same layer; and
   the third connection electrode is connected to the power supply line and the fifth connection electrode, and the fifth connection electrode is connected to the third connection electrode and the cathode.

4. The display substrate according to claim 1, wherein the base substrate comprises a first flexible material layer and a first barrier layer disposed on the first flexible material layer, and the composite wiring layer is disposed on the first barrier layer.

5. The display substrate according to claim 1, wherein the base substrate comprises a first flexible material layer, a first barrier layer disposed on the first flexible material layer, a second insulating layer, and a second flexible material layer disposed on the second insulating layer, and the composite wiring layer is disposed between the first barrier layer and the second insulating layer.

6. The display substrate according to claim 1, wherein an edge of the blank corner cutting region facing the bezel region is a first arc, and an edge of the corner display region facing the bezel region is a second arc, wherein the first arc and the second arc are located on a circle with a same center and a same radius.

7. The display substrate according to claim 6, wherein an arc length of the first arc is 18 to 35 microns and an arc length of the second arc is 180 to 250 microns.

8. A display apparatus, comprising the display substrate according to claim 1.

9. A method for preparing a display substrate, wherein the display substrate comprises a display region and a bezel region, the display region comprises a plurality of corner regions, and at least one of the plurality of corner regions comprises a corner display region and a blank corner cutting region which are alternately disposed, the preparation method comprises:
   forming a composite wiring layer on a base substrate, wherein the composite wiring layer of the corner display region comprises a first wiring layer, a second wiring layer and a first insulating layer disposed between the first wiring layer and the second wiring layer, wherein the first wiring layer comprises a gate line and the second wiring layer comprises a data line;
   forming a drive structure layer on the composite wiring layer, wherein the drive structure layer of the corner display region comprises a pixel drive circuit and a plurality of connection electrodes;
   forming a light-emitting element on the drive structure layer, removing all film layer structures in the blank corner cutting region, wherein the gate line, the data line, and the light-emitting element are connected to the pixel drive circuit through the plurality of connection electrodes.

10. The preparation method according to claim 9, wherein, the pixel drive circuit comprises a first transistor, the plurality of connection electrodes comprise a first connection electrode, a second connection electrode and a fourth connection electrode, the light-emitting element comprises an anode, a cathode and an organic light-emitting layer disposed between the anode and the cathode, and the bezel region comprises a power supply line, a third connection electrode and a fifth connection electrode;
   the drive structure layer comprises a second insulating layer disposed on the composite wiring layer, an active layer disposed on the second insulating layer, a third insulating layer covering the active layer, a first gate metal layer disposed on the third insulating layer, a fourth insulating layer covering the first gate metal layer, a second gate metal layer disposed on the fourth insulating layer, a fifth insulating layer covering the second gate metal layer, a first source and drain metal layer disposed on the fifth insulating layer, a passivation layer disposed on the first source and drain metal layer, a first planarization layer disposed on the passivation layer, a metal conductive layer on the planarization layer, and a second planarization layer disposed on the metal conductive layer;

wherein the power supply line is disposed on the first wiring layer or the second wiring layer;

the first connection electrode is disposed on the second gate metal layer and is connected to the gate line and a gate electrode of the first transistor;

the second connection electrode and the third connection electrode are disposed on the first source and drain metal layer, the second connection electrode is connected to the data line and a source electrode of the first transistor, and the third connection electrode is connected to the power supply line and the fifth connection electrode;

the fourth connection electrode is disposed on the metal conductive layer and is connected to the anode and a drain electrode of the first transistor; and the fifth connection electrode is disposed in a same layer as the anode, and is connected to the third connection electrode and the cathode.

11. A method for bonding a display panel, wherein the display panel comprises a display region and a bezel region, the display region comprises a plurality of corner regions, and at least one of the plurality of corner regions comprises a corner display region and a blank corner cutting region which are alternately disposed; and the bonding method comprises:

forming an optical adhesive layer on a side of the display panel facing a cover plate, wherein the optical adhesive layer comprises a plurality of first fan-shaped regions and first opening regions which are alternately disposed; an orthographic projection of the corner display region on the display panel comprises an orthographic projection of the first fan-shaped regions on the display panel, and an orthographic projection of the first opening regions on the display panel comprises an orthographic projection of the blank corner cutting region on the display panel;

bonding a back film on a side of the display panel away from the cover plate;

pulling the display panel through a carrier film for copying; and bonding the display panel to the cover plate, and removing the carrier film.

12. The bonding method according to claim 11, wherein the back film comprises a plurality of second fan-shaped regions and second opening regions which are alternately disposed; an orthographic projection of the corner display region on the display panel comprises an orthographic projection of the second fan-shaped regions on the display panel, and an orthographic projection of the second opening regions on the display panel comprises the orthographic projection of the blank corner cutting region on the display panel; and the carrier film comprises a plurality of third fan-shaped regions and third opening regions which are alternately disposed; an orthographic projection of the corner display region on the display panel comprises an orthographic projection of the third fan-shaped regions on the display panel, and an orthographic projection of the third opening regions on the display panel comprises the orthographic projection of the blank corner cutting region on the display panel.

13. The bonding method according to claim 12, wherein an edge of the corner display region facing the bezel region is a second arc;

an edge of a first fan-shaped region facing the bezel region is a third arc, and an arc length of the third arc is smaller than the arc length of the second arc by 20 microns to 50 microns;

an edge of a second fan-shaped region facing the bezel region is a fourth arc, and an arc length of the fourth arc is smaller than the arc length of the second arc by 20 microns to 50 microns; and an edge of a third fan-shaped region facing the bezel region is a fifth arc, and an arc length of the fifth arc is smaller than the arc length of the second arc by 20 microns to 50 microns.

14. The bonding method according to claim 11, wherein the back film comprises a fourth opening region, and an orthographic projection of the fourth opening region on the display panel comprises the orthographic projection of the corner region on the display panel; and the carrier film comprises a fifth opening region, and an orthographic projection of the fifth opening region on the display panel comprises the orthographic projection of the corner region on the display panel.

* * * * *